United States Patent
Ito et al.

(10) Patent No.: US 8,692,132 B2
(45) Date of Patent: *Apr. 8, 2014

(54) MULTILAYERED PRINTED CIRCUIT BOARD AND METHOD FOR MANUFACTURING THE SAME

(75) Inventors: Sotaro Ito, Gifu (JP); Michimasa Takahashi, Gifu (JP); Yukinobu Mikado, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/242,488

(22) Filed: Sep. 23, 2011

(65) Prior Publication Data

US 2012/0006587 A1  Jan. 12, 2012

Related U.S. Application Data

(63) Continuation of application No. 11/580,165, filed on Oct. 13, 2006, now Pat. No. 8,101,868.

(30) Foreign Application Priority Data

Oct. 14, 2005  (JP) .................................. 2005-300349

(51) Int. Cl.
    *H05K 1/16*  (2006.01)
(52) U.S. Cl.
    USPC .......................... 174/260; 174/252; 174/262
(58) Field of Classification Search
    None
    See application file for complete search history.

(56) References Cited

U.S. PATENT DOCUMENTS

| | | | |
|---|---|---|---|
| 4,640,010 A | 2/1987 | Brown | |
| 5,306,670 A | 4/1994 | Mowatt et al. | |
| 5,432,677 A | 7/1995 | Mowatt et al. | |
| 5,506,755 A * | 4/1996 | Miyagi et al. | 361/720 |
| 6,239,980 B1 | 5/2001 | Fillion et al. | |
| 6,538,210 B2 | 3/2003 | Sugaya et al. | |
| 6,983,535 B2 | 1/2006 | Crockett et al. | |
| 7,023,073 B2 | 4/2006 | Mano | |
| 7,217,888 B2 | 5/2007 | Sunohara et al. | |
| 7,285,728 B2 | 10/2007 | Sunohara et al. | |
| 7,362,576 B2 * | 4/2008 | Takeda et al. | 361/704 |
| 7,396,700 B2 * | 7/2008 | Hsu | 438/107 |
| 7,639,473 B2 | 12/2009 | Hsu et al. | |
| 7,727,802 B2 * | 6/2010 | Sunohara et al. | 438/107 |
| 7,884,461 B2 | 2/2011 | Hu et al. | |
| 7,894,203 B2 | 2/2011 | Kariya et al. | |
| 7,957,154 B2 | 6/2011 | Ito et al. | |
| 8,101,868 B2 * | 1/2012 | Ito et al. | 174/260 |
| 2003/0060172 A1 | 3/2003 | Kuriyama et al. | |
| 2003/0116843 A1 | 6/2003 | Iijima et al. | |

(Continued)

FOREIGN PATENT DOCUMENTS

| CN | 1402340 A | 3/2003 |
|---|---|---|
| CN | 1601736 A | 3/2005 |

(Continued)

*Primary Examiner* — Ishwarbhai B Patel
(74) *Attorney, Agent, or Firm* — Oblon, Spivak, McClelland, Maier & Neustadt, L.L.P.

(57) ABSTRACT

A method for manufacturing a multilayered printed circuit board including forming a first insulating resin substrate having a metal layer substantially corresponding to dimensions of a semiconductor device, forming a second insulating resin substrate, forming a recess extending to the metal layer of the first insulating resin substrate such that a surface of the metal layer is exposed, accommodating the semiconductor device in the recess such that the semiconductor device is mounted on the surface of the metal layer, and forming a resin insulating layer on the first insulating resin substrate such that the semiconductor device accommodated in the recess is covered.

20 Claims, 8 Drawing Sheets

(56) References Cited

U.S. PATENT DOCUMENTS

| | | |
|---|---|---|
| 2005/0017347 A1 | 1/2005 | Morimoto et al. |
| 2005/0048759 A1 | 3/2005 | Hsu |
| 2005/0062151 A1 | 3/2005 | Nagao |
| 2006/0014327 A1 | 1/2006 | Cho et al. |
| 2006/0021791 A1 | 2/2006 | Sunohara et al. |
| 2006/0042078 A1 | 3/2006 | Takeuchi et al. |
| 2009/0188703 A1 | 7/2009 | Ito et al. |
| 2011/0176284 A1 | 7/2011 | Ito et al. |

FOREIGN PATENT DOCUMENTS

| | | |
|---|---|---|
| JP | 11-54939 | 2/1999 |
| JP | 2000-312063 | 11/2000 |
| JP | 2001-274034 | 10/2001 |
| JP | 2001-339165 | 12/2001 |
| JP | 2002-16327 | 1/2002 |
| JP | 2002-50874 | 2/2002 |
| JP | 2002-246722 | 8/2002 |
| JP | 2002-353633 | 12/2002 |
| JP | 2004-153084 | 5/2004 |
| JP | 3659167 B2 | 6/2005 |
| JP | 2006-32887 | 2/2006 |
| KR | 10-2006-0005840 | 1/2006 |
| KR | 10-2006-0050893 | 5/2006 |
| TW | 200528007 A | 8/2005 |
| WO | WO 03/105222 A1 | 12/2003 |

* cited by examiner

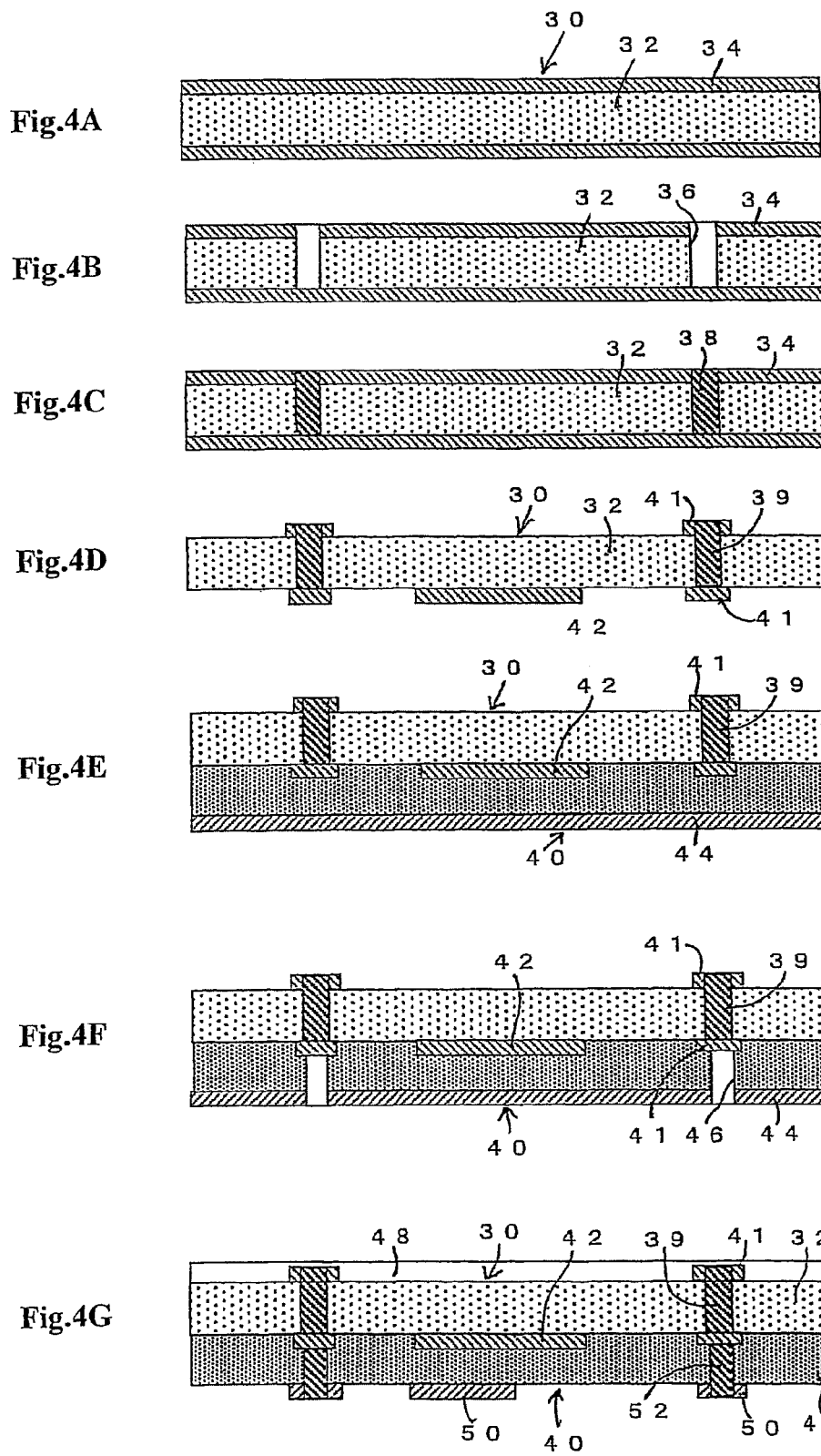

MULTILAYERED PRINTED CIRCUIT BOARD AND METHOD FOR MANUFACTURING THE SAME

CROSS-REFERENCE TO RELATED APPLICATIONS

This application is a continuation of and claims the benefit of priority from U.S. application Ser. No. 11/580,165, filed Oct. 13, 2006, the entire contents of which are hereby incorporated by reference. U.S. application Ser. No. 11/580,165 is based upon and claims the benefit of priority from Japanese Application No. 2005-300349, filed Oct. 14, 2005.

TECHNICAL FIELD

The present invention relates to a multilayered printed circuit board in which an electronic component (semiconductor device) such as an IC is installed and to a method for manufacturing the same.

BACKGROUND ART

Examples of a multilayered printed circuit board in which a semiconductor device is installed include multilayered printed circuit boards disclosed in Japanese Unexamined Patent Application Publication Nos. 2001-339165 and 2002-050874. The multilayered printed circuit boards disclosed in these patent documents include a substrate having a recess for embedding a semiconductor device, a semiconductor device embedded in the recess of the substrate, an insulating layer provided on the substrate so as to cover the semiconductor device, a conductor circuit provided on the surface of the insulating layer, and via holes provided in the insulating layer so as to electrically connect the conductor circuit to pads of the semiconductor device.

In such a known multilayered printed circuit board, external connection terminals (such as PGA or BGA) are provided on the surface of the outermost layer. The semiconductor device installed in the substrate is electrically connected to the outside via the external connection terminals.

SUMMARY OF THE INVENTION

In a multilayered printed circuit board according to an embodiment of the present invention, even when a substrate for accommodating a semiconductor device is composed of a resin, electrical connectivity and connection reliability can be ensured. In addition, in a reliability test, connection reliability between pads of the semiconductor device and a conductor circuit including via holes that are connected to the pads can be ensured in the multilayered printed circuit board.

An embodiment of the present invention provides a multilayered printed circuit board including a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the semiconductor device is accommodated in a recess provided in the first resin insulating layer, and a metal layer for placing the semiconductor device is provided on the bottom face of the recess.

An embodiment of the present invention provides a multilayered printed circuit board including a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the semiconductor device is accommodated in a recess provided in the first resin insulating layer, a metal layer for placing the semiconductor device is provided on the bottom face of the recess, and the second resin insulating layer includes a fiber substrate.

An embodiment of the present invention provides a multilayered printed circuit board including a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the semiconductor device is accommodated in a recess provided in the first resin insulating layer, a metal layer for placing the semiconductor device is provided on the bottom face of the recess, and the area of the metal layer is larger than the area of the bottom face of the recess.

An embodiment of the present invention provides a multilayered printed circuit board including a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the semiconductor device is accommodated in a recess provided in the first resin insulating layer, a metal layer for placing the semiconductor device is provided on the bottom face of the recess, and the wall surfaces of the recess are exposed.

An embodiment of the present invention provides a multilayered printed circuit board including a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the semiconductor device is accommodated in a recess provided in the first resin insulating layer, a metal layer for placing the semiconductor device is provided on the bottom face of the recess, and openings constituting the via holes are filled with a conductive substance.

An embodiment of the present invention provides a multilayered printed circuit board including a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the side faces of the recess form a tapered shape diverging from the bottom face upwards.

Furthermore, according to a method for manufacturing a multilayered printed circuit board according to an embodiment of the present invention, in a method for manufacturing a multilayered printed circuit board wherein a semiconductor device is accommodated and fixed in a first resin insulating layer, a second resin insulating layer and a conductor circuit are provided on the first resin insulating layer, and the semiconductor device is electrically connected to the conductor circuit through via holes, the method includes the steps of:

forming a first insulating resin substrate by forming on a first surface of the first resin insulating layer at least a conductor circuit and a metal layer having a predetermined area corresponding to the dimensions of the semiconductor device to be accommodated, forming on a second surface of the first resin insulating layer at least a conductor circuit and an area that does not have the conductor circuit thereon, the area having a predetermined area corresponding the dimensions of the semiconductor device at a position facing the metal layer, and forming via holes for electrically connecting the conductor circuit on the first surface to the conductor circuit on the second surface;

bonding a second insulating resin substrate prepared by applying a copper foil on a first surface of a third resin insulating layer onto the first surface of the first insulating resin substrate under pressure to integrate the substrates;

forming a conductor circuit on the first surface of the second insulating resin substrate and forming via holes for electrically connecting the conductor circuit formed on the first surface of the second insulating resin substrate to the conductor circuit formed on the first surface of the first insulating resin substrate;

forming, on the area of the first insulating resin substrate that does not have the conductor circuit thereon, a recess extending from the surface of the first resin insulating layer to the surface of the metal layer so as to expose the surface of the metal layer;

accommodating a semiconductor device in the recess, and bonding and fixing the semiconductor device on the surface of the metal layer exposed in the recess, with an adhesive therebetween; and covering the semiconductor device, forming the second resin insulating layer and a conductor circuit thereon, and then forming via holes for electrically connecting the semiconductor device and the conductor circuit.

BRIEF DESCRIPTION OF THE DRAWINGS

FIGS. 4A to 4G are schematic cross-sectional views showing some steps of manufacturing a multilayered printed circuit board according to Example 1 of the present invention.

DESCRIPTION OF THE PREFERRED EMBODIMENTS

Figure 1:
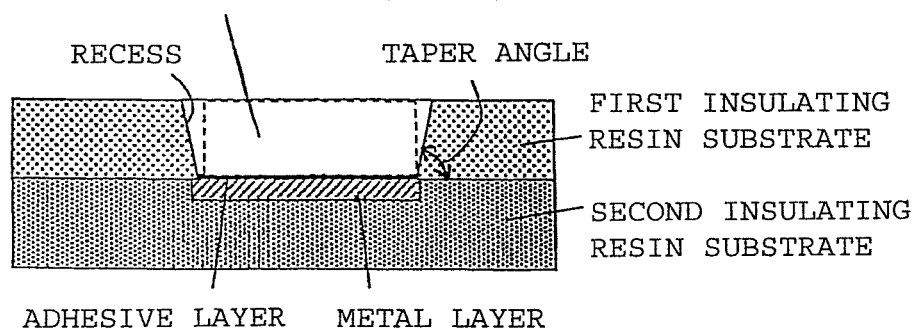
FIG. 1 is a schematic cross-sectional view illustrating a multilayered printed circuit board in which a semiconductor device is accommodated and embedded according to the present invention.

A multilayered printed circuit board according to an embodiment of the present invention includes a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the semiconductor device is accommodated in a recess provided in the first resin insulating layer, and a metal layer for placing the semiconductor device is provided on the bottom face of the recess.

Accordingly, by forming the metal layer on the bottom of the recess of the first resin insulating layer for accommodating the semiconductor device, the depth of the recess can be made uniform. Therefore, the phenomenon in which the semiconductor device is accommodated and installed in the recess in a tilted manner can be prevented. Even when the substrate accommodating the semiconductor device is composed of a resin, electrical connectivity and connection reliability between connection pads of the semiconductor device and the conductor circuit including via holes connected to the connection pads can be ensured.

In this embodiment, a conductor circuit may be provided on the first resin insulating layer accommodating the semiconductor device, and the conductor circuit may be electrically connected to the conductor circuit provided on the second resin insulating layer through via holes, and more preferably via holes filled with a metal.

The thickness of the first resin insulating layer accommodating the semiconductor device is preferably larger than the thickness of the second resin insulating layer. Accordingly, for example, warpage of the first resin insulating layer accommodating the semiconductor device caused by heat etc. does not easily occur. Therefore, connectivity between the semiconductor device and via holes connected thereto and reliability thereof can be easily ensured.

Furthermore, the conductor circuit on the second resin insulating layer may be provided so as to extend over an area that exceeds the boundary between the semiconductor device and the first resin insulating layer accommodating the semiconductor device. Accordingly, the degree of freedom of wiring between the semiconductor device and the conductor circuit connected thereto can be increased. Furthermore, since solder pads connected to the outside and via holes connected to the semiconductor device are far from each other, the multilayered printed circuit board is not easily affected by stress due to, for example, heat received on the solder pads functioning as an external connection terminal. Therefore, it is believed that connectivity and reliability can also be ensured.

Furthermore, the multilayered printed circuit board may further include via holes connected to the metal layer, and heat generated on the semiconductor device may be dissipated through these via holes connected to the metal layer. That is, thermal vias connected to the metal layer may be formed, thereby dissipating heat from the semiconductor device that is received on the metal layer to the outside.

A multilayered printed circuit board according to an embodiment of the present invention includes a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the semiconductor device is accommodated in a recess provided in the first resin insulating layer, a metal layer for placing the semiconductor device is provided on the bottom face of the recess, and the area of the metal layer is larger than the area of the bottom face of the recess.

According to this structure, the semiconductor device can be reliably accommodated. Furthermore, tolerance of misalignment during the formation of the recess of the substrate can be increased. Therefore, the depth of the recess provided in the first resin insulating layer can be easily made uniform, and the multilayered printed circuit board is not easily affected by other factors (for example, an effect of irregularities during the formation of the recess and an effect during the formation of the metal layer).

In such an embodiment, at least a surface of the metal layer, the surface being exposed on the bottom face of the recess, is preferably planarized. In this case, the thickness of an adhesive layer formed between the semiconductor device and the metal layer can be easily made uniform. Consequently, the adhesiveness of the semiconductor device can be made uniform, and the adhesiveness can be easily ensured even when a reliability test is repeatedly performed under a heat-cycle condition.

The metal layer is preferably formed of a rolled copper foil. When the metal layer is formed using a rolled copper foil, the flatness of the metal layer can be easily ensured. In addition, the semiconductor device can be reliably accommodated, and the adhesiveness to the semiconductor device can be easily ensured.

The wall surfaces of the recess of the first resin insulating layer are preferably exposed. That is, when the semiconductor device is accommodated, the wall surfaces of the recess are exposed. Accordingly, the semiconductor device can be reliably accommodated. Furthermore, the clearance between the wall surfaces of the recess and the side faces of the semiconductor device can be filled with an adhesive or another resin insulating layer, and bondability of the semiconductor device and electrical connectivity of the semiconductor device can be easily ensured.

The metal layer is preferably exposed by laser processing. In this case, a recess having a uniform depth can be easily produced.

The thickness of the part of the metal layer exposed in the recess is preferably smaller than the thickness of the non-exposed part of the metal layer. In this case, since a cavity is formed on the area where the semiconductor device is accommodated, it is believed that the semiconductor device can be reliably accommodated.

The surface layer of the part of the metal layer exposed in the recess preferably has a shiny surface. The adhesiveness between the metal layer and the semiconductor device can be easily ensured on the shiny surface. In addition, connectivity and reliability of the semiconductor device can be easily ensured on the shiny surface. Furthermore, the thickness of an adhesive layer formed between the semiconductor device and the metal layer can be easily made uniform. Consequently, the adhesiveness of the semiconductor device can be made uniform, and the adhesiveness can be easily ensured even when a reliability test is repeatedly performed under a heat-cycle condition.

Another surface of the metal layer, the surface being opposite to the surface exposed in the recess, preferably has a matte surface. In this case, adhesiveness to another resin insulating layer can be easily ensured.

The semiconductor device is preferably bonded on the metal layer, with an adhesive layer therebetween. When the adhesive layer is provided on the metal layer, a uniform adhesive layer can be easily formed, and bondability of the semiconductor device can be easily ensured. Furthermore, connectivity with via holes connected to the semiconductor device and reliability can be easily ensured.

The adhesive layer is preferably in contact with the bottom face of the semiconductor device and the bottom periphery of the side faces of the semiconductor device. When the adhesive layer is in contact with the bottom face and the bottom periphery of the side faces of the semiconductor device, the adhesiveness of the semiconductor device can be easily ensured.

The metal layer is preferably installed in a substrate for accommodating a semiconductor device in advance, or the surface of the metal layer is preferably planarized. When the metal layer is installed in the substrate, the multilayered printed circuit board is not easily affected by other factors (for example, an effect of irregularities during the formation of the recess and an effect during the formation of the metal layer), and the flatness of the metal layer is not easily degraded. Consequently, the depth of the recess provided in the first resin insulating layer can be easily made uniform, and the adhesiveness to a semiconductor device can be easily ensured.

When a semiconductor device is accommodated in the recess, the tilt of the semiconductor device can be prevented. Accordingly, when via holes connected to pads of the accommodated semiconductor device are formed in the second resin insulating layer, via holes having a desired shape can be formed. When the metal layer is substantially planarized, the electrode pads disposed on the surface of the semiconductor device are also substantially planarized and thus connectivity in the via holes can be easily ensured.

Furthermore, the side faces of the recess for accommodating a semiconductor device may have a tapered shape. In such a case, even when the semiconductor device accommodated in the recess is subjected to stress (for example, thermal stress or external stress) in the lateral direction, the stress can be relieved.

In addition, the phenomenon in which an adhesive used for fixing the semiconductor device is diffused along the side faces of the recess does not occur, and the adhesiveness of the semiconductor device to the bottom of the recess is not easily decreased.

In the above embodiment, a columnar electrode or an intermediate layer is preferably provided on a pad of the semiconductor device. Accordingly, electrical connection between the pad of the semiconductor device and a via hole can be easily established.

Pads of a semiconductor device are commonly formed of aluminum or the like. In particular, when the pads do not include an intermediate layer and are simply formed of aluminum or the like and via holes are formed in an interlayer insulating layer by photoetching, the resin easily remains on the surface of the pads after exposure and development, and adhesion of a developer may change the color of the pads.

On the other hand, when via holes are formed by laser machining, pads formed of aluminum or the like may be burned out. When the laser irradiation is performed under conditions that do not result in such burning, the resin may remain on the pads. Furthermore, when post-processes (such as a step of immersing in an acid, an oxidant, or an etchant, a step of various types of annealing, and other processes) are performed, the color of the pads of the semiconductor device may be changed or the pads may be dissolved. The pads of the semiconductor device are formed so as to have a diameter of about 40 μm, and via holes are formed so as to have a larger diameter. Accordingly, a misalignment or the like may be easily generated, and a problem of, for example, a connection failure between the pads and the via holes easily occurs.

On the other hand, when an intermediate layer formed of copper or the like is provided on the pads of the semiconductor device, the problem during the formation of the via holes is eliminated and solvents can be used. Accordingly, a resin can be prevented from remaining on the pads, and the change in the color of the pads and dissolution of the pads do not occur even after post-processes. Accordingly, electrical connectivity and connection reliability between pads and via holes are not easily degraded. Furthermore, when an intermediate layer having a diameter larger than that of a die pad of the semiconductor device is interposed, the pads and the via holes can be reliably connected.

Furthermore, when an intermediate layer is provided, checking of operations and electrical testing of the semiconductor device can be easily performed before the semiconductor device is embedded in the printed circuit board or accommodated, or after the semiconductor device is accommodated. The reason for this is that, since the intermediate layer having a diameter larger than that of the pads of the semiconductor device is provided, a probe pin for testing can be easily contacted with the intermediate layer. Consequently, whether or not the product has an acceptable quality can be determined in advance. This is advantageous in view of productivity and reduction in costs. Furthermore, for example, removal of pads and the formation of scratches thereon due to contact with the probe do not easily occur. Accordingly, by forming the intermediate layer on the pads of the semiconductor device, the semiconductor device can be suitably embedded and accommodated in the printed circuit board.

A multilayered printed circuit board according to an embodiment of the present invention includes a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the semiconductor device is accommodated in a recess provided in the first resin insulating layer, a metal layer for placing the semiconductor device is provided on the bottom face of the recess, and the wall surfaces of the recess are exposed.

In this embodiment, a space formed by the wall surfaces of the recess and the side faces of the semiconductor device is preferably filled with a resin layer. When the space is filled with a resin, the semiconductor device can be stably disposed, and connectivity and reliability of the semiconductor device can be easily ensured.

In addition, preferably, the space formed by the wall surfaces of the recess and the side faces of the semiconductor device is filled with a resin insulating layer, and the resin insulating layer is integrated with the semiconductor device. In this case, the resin insulating layer in which via holes are formed and the resin insulating layer filling the space formed by the wall surfaces of the recess and the side faces of the semiconductor device are composed of the same material. Accordingly, the generation of thermal stress due to, for example, the difference in the thermal expansion coefficient between materials can be suppressed, and the semiconductor device can be stably disposed. Thus, connectivity and reliability of the semiconductor device can be easily ensured.

The side faces of the recess provided in the substrate may form a tapered shape diverging from the bottom face upwards.

A columnar electrode or an intermediate layer may be provided on a pad of the semiconductor device, and the pad of the semiconductor device may be electrically connected to the via hole through the columnar electrode or the intermediate layer.

A multilayered printed circuit board according to an embodiment of the present invention includes a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the semiconductor device is accommodated in a recess provided in the first resin insulating layer, a metal layer for placing the semiconductor device is provided on the bottom face of the recess, and openings constituting the via holes are filled with a conductive substance.

In this embodiment, since the via holes are so-called filled vias, electrical characteristics when the via holes are connected to the semiconductor device can be easily stabilized. It is believed that connectivity can be easily stabilized accordingly. Furthermore, when an insulating layer or a conductor layer is provided as an upper layer of the via holes, irregularities or the like are not easily formed and electrical connectivity can be easily ensured. Examples of the conductive substance include a plated metal and conductive paste.

The via holes preferably have a concave shape, viewed from the side. That is, the via holes preferably have a shape that is concave toward the inside in the thickness direction. Accordingly, since a resin insulating layer is fitted with the via holes, it is believed that a satisfactory bondability of the via holes can be easily realized.

Solder pads are preferably provided above the semiconductor device. In this case, the distance between the solder pads and the semiconductor device can be easily minimized, and satisfactory electrical characteristics can be easily obtained.

In this embodiment, preferably, the multilayered printed circuit board further includes at least one resin insulating layer laminated on the second resin insulating layer, and via holes for connecting to the conductor circuit. Accordingly, the layout of wiring can be further extended. For example, the positions of the semiconductor device and external connections can be shifted. Thus, it is believed that connectivity and reliability can be easily obtained.

Furthermore, preferably, a columnar electrode or an intermediate layer is provided on a pad of the semiconductor device, and the pad is electrically connected to the via hole through the columnar electrode or the intermediate layer.

A multilayered printed circuit board according to an embodiment of the present invention includes a semiconductor device, a first resin insulating layer accommodating the semiconductor device, a second resin insulating layer provided on the first resin insulating layer, a conductor circuit provided on the second resin insulating layer, and via holes for electrically connecting the semiconductor device to the conductor circuit, wherein the side faces of the recess form a tapered shape diverging from the bottom face upwards.

In this embodiment, regarding the tapered shape of the recess, among the angles formed by a side face and the bottom face of the recess, the smaller angle is preferably in the range of at least 60 degrees and less than 90 degrees. In such a case, stress applied on the side face of the semiconductor device can be relieved, thereby suppressing the displacement of the semiconductor device.

The wall surfaces of the recess are preferably exposed. Accordingly, the shape of the recess can be stabilized, and a space for accommodating the semiconductor device can be ensured.

A space formed by the wall surfaces of the recess and the side faces of the semiconductor device is preferably filled with a resin layer. When the space is filled with a resin, the semiconductor device can be stably disposed. Accordingly, connectivity and reliability of the semiconductor device can be easily ensured.

Furthermore, preferably, a space formed by the wall surfaces of the recess and the side faces of the semiconductor device is filled with a resin insulating layer, and the resin insulating layer is integrated with the semiconductor device. In this case, the resin insulating layer in which via holes are formed and the resin insulating layer filling the space formed by the wall surfaces of the recess and the side faces of the semiconductor device are composed of the same material. Accordingly, the generation of thermal stress due to, for example, the difference in the thermal expansion coefficient between materials can be suppressed, and the semiconductor device can be stably disposed. Thus, connectivity and reliability of the semiconductor device can be easily ensured.

According to a method for manufacturing a multilayered printed circuit board according to an embodiment of the present invention, in a method for manufacturing a multilayered printed circuit board wherein a semiconductor device is accommodated and fixed in a first resin insulating layer, a second resin insulating layer and a conductor circuit are provided on the first resin insulating layer, and the semiconductor device is electrically connected to the conductor circuit through via holes, the method includes the steps of:

forming a first insulating resin substrate by forming on a first surface of the first resin insulating layer at least a conductor circuit and a metal layer having a predetermined area corresponding to the dimensions of the semiconductor device to be accommodated, forming on a second surface of the first resin insulating layer at least a conductor circuit and an area that does not have the conductor circuit thereon, the area having a predetermined area corresponding the dimensions of the semiconductor device at a position facing the metal layer, and forming via holes for electrically connecting the conductor circuit on the first surface to the conductor circuit on the second surface;

bonding a second insulating resin substrate prepared by applying a copper foil on a first surface of a third resin insulating layer onto the first surface of the first insulating resin substrate under pressure to integrate the substrates;

forming a conductor circuit on the first surface of the second insulating resin substrate and forming via holes for electrically connecting the conductor circuit formed on the first surface of the second insulating resin substrate to the conductor circuit formed on the first surface of the first insulating resin substrate;

forming, on the area of the first insulating resin substrate that does not have the conductor circuit thereon, a recess extending from the surface of the first resin insulating layer to the surface of the metal layer so as to expose the surface of the metal layer;

accommodating a semiconductor device in the recess, and bonding and fixing the semiconductor device on the surface of the metal layer exposed in the recess, with an adhesive therebetween; and covering the semiconductor device, forming the second resin insulating layer and a conductor circuit thereon, and then forming via holes for electrically connecting the semiconductor device and the conductor circuit.

In the embodiment of the above method, the recess is preferably formed by laser irradiation.

The side faces of the recess preferably form a tapered shape diverging from the bottom face upwards.

When a columnar electrode or an intermediate layer is formed on a pad of the semiconductor device in advance, the pad can be electrically connected to the via hole through the columnar electrode or the intermediate layer.

According to this embodiment, by forming the metal layer on the bottom face of the recess provided on the first resin insulating layer, the depth of the recess can be easily made uniform. When the recess particularly has a rectangular cross section, the depth of the recess around the four corners can also be easily made uniform.

Furthermore, since the metal layer is substantially planarized, electrical connectivity and connection reliability can be further easily ensured. Since the metal layer is formed in the resin insulating layer, warpage due to thermal stress, external stress, or the like is not easily generated. Consequently, for example, since connection failure between connection pads of the semiconductor device and a conductor circuit including via holes does not easily occur, electrical connectivity and connection reliability can be easily ensured.

A multilayered printed circuit board of the present invention will now be described in detail with reference to the attached drawings.

Examples of a resin insulating layer for accommodating a semiconductor device that can be used in an embodiment of the present invention include a hard laminated substrate selected from a glass-cloth epoxy resin substrate, a phenol resin substrate, a glass-cloth bismaleimide-triazine resin substrate, a glass-cloth polyphenylene ether resin substrate, an aramid non-woven fabric epoxy resin substrate, an aramid non-woven fabric polyimide resin substrate, and the like. These are preferably fiber substrates such as a glass epoxy or a resin material in which a prepreg or a core material is impregnated. In addition to these, substrates that are generally used for printed circuit boards can be used. For example, a double-sided or single-sided copper clad laminate, a resin plate that does not have a metal film, a resin film, or a composite material of these can also be used.

The thickness of the resin substrate is preferably in the range of about 20 to 350 μm. When the thickness is within the above range, the insulating property of an interlayer insulating layer can be easily ensured, via holes for interlayer connection can be easily formed, and electrical connectivity is not easily degraded.

In the embodiment of the present invention, copper is preferably used as the metal layer used for forming a conductor circuit and the metal layer formed on the bottom face of the recess provided in the resin insulating layer because copper can be easily processed by etching. Accordingly, the size of the metal layer can be freely changed. In addition, when electrical connectivity is provided to the metal layer formed on the bottom face of the recess, a copper metal layer has excellent electrical characteristics.

The thickness of a copper foil used for forming a conductor circuit is preferably in the range of about 5 to 20 μm. In the case where the thickness of the copper foil is within the above range, when openings for forming via holes are made in the insulating resin substrate by laser machining as described below, the copper foil disposed at the periphery of the openings is not deformed and the conductor circuit can be easily formed. Furthermore, a conductor circuit pattern having a fine line-width can be easily formed by etching.

The thickness of the copper foil used in the embodiment of the present invention may be adjusted by a half-etching process. In such a case, the copper foil applied on the resin insulating layer preferably has a thickness larger than the above numerical values, and the thickness of the copper foil is preferably adjusted to about 5 to 20 μm after etching.

In a double-sided copper clad laminate, the thickness of the copper foil is preferably within the above range, but the thickness may be different between both sides. Thus, for example, the strength of the laminate is ensured so that a post-process may be performed smoothly.

A copper foil serving as the metal layer provided on the bottom face of the recess preferably has a thickness of about 5 to 20 μm. When the thickness of the copper foil is within the above range, the copper foil is not easily pierced during a cavity processing. Therefore, the effect of forming the metal layer is not cancelled out. Furthermore, the metal layer can be easily formed by etching.

Instead of copper, a metal such as nickel, iron, or cobalt may be used for the metal layer provided on the bottom face of the recess. Alternatively, an alloy containing at least one of these metals may also be used.

As regards the insulating resin substrate and the copper foil, in particular, a single-sided or double-sided copper clad laminate produced by laminating a copper foil on a B-stage prepreg in which a glass cloth is impregnated with an epoxy resin and then pressing the laminate under heating is preferably used. In such a copper clad laminate, the positions of a wiring pattern and via holes are not shifted during handling of the laminate after the copper foil is etched, and thus the accuracy of the positions is excellent.

In the embodiment of the present invention, the recess for accommodating a semiconductor device, the recess being provided in the resin insulating layer, can be formed by laser machining, a counterboring process, or punching. In particular, the recess is preferably formed by laser machining.

When the recess is formed by laser machining, the uniformity of the depth of the recess can be easily achieved and, in particular, the uniformity of the depth to the metal layer is excellent compared with the counterboring process. Consequently, for example, when a semiconductor device is accommodated in the recess, a problem of a tilt of the semiconductor device can be suppressed. Furthermore, a processing to obtain a tapered shape described below can be accurately performed.

When the recess is formed by the counterboring process, since the metal layer provided on the bottom face of the recess functions as a stopper, the depth of the recess can be made uniform.

The depth of the recess is determined in accordance with the thickness of the semiconductor device to be accommodated therein and the thickness of the columnar electrode or the intermediate layer that may be formed on a connection pad of the semiconductor device. Since a metal layer that is substantially flat is formed on the entire surface of the bottom of the recess, an adhesive layer provided between the semiconductor device and the resin insulating layer can easily have a uniform thickness.

As a result, the adhesiveness between the semiconductor device and the resin insulating layer can be uniformly maintained. Therefore, even when a reliability test is repeatedly performed under a heat-cycle condition, the adhesiveness can be easily ensured.

Figure 10A:
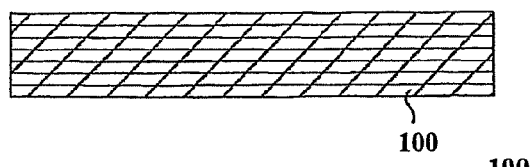
FIGS. 10A to 10D are schematic cross-sectional views showing some steps of manufacturing a multilayered printed circuit board in which a semiconductor device is accommodated and embedded according to a related art.
Figure 10B:
Figure 10C:
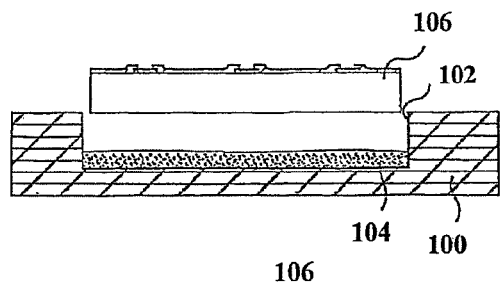
Figure 10D:
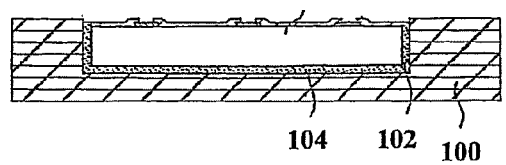
Figure 11:
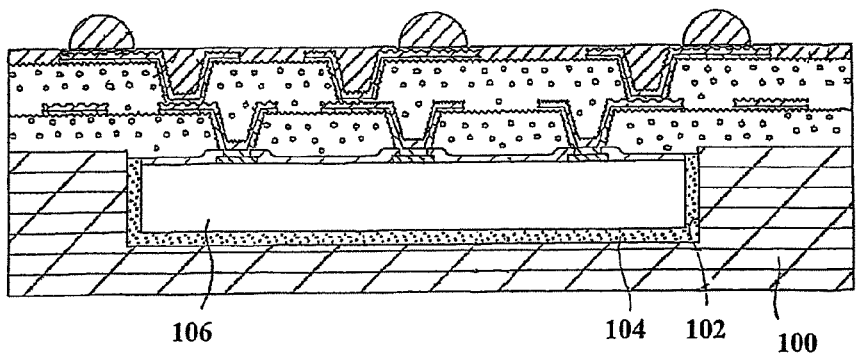
FIG. 11 is a schematic cross-sectional view illustrating the multilayered printed circuit board according to the related art.
Figure 12:
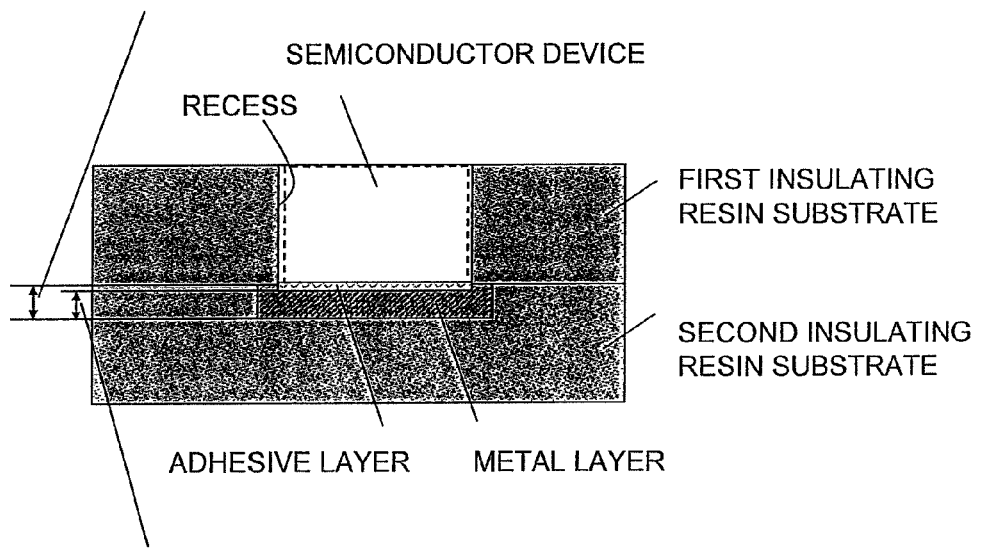
FIG. 12 is a schematic cross-sectional view illustrating the thicknesses of the exposed and non-exposed parts of metal layer.

In a related art, a recess for accommodating a semiconductor device is formed in an insulating substrate composed of only a resin insulating layer by, for example, machining. FIGS. 10A to 10D show an example of steps of manufacturing such a printed circuit board. As shown in FIG. 10A, first, an insulating substrate 100 composed of a resin insulating layer is prepared. As shown in FIG. 10B, a recess 102 is then formed in the insulating substrate 100 by machining (such as punching or a counterboring process). As shown in FIGS. 10C and 10D, an adhesive layer 104 is formed on the bottom of the recess 102 and a semiconductor device 106 is then accommodated. Accordingly, a printed circuit board in which the semiconductor device 106 is accommodated in the insulating substrate 100 is produced (see FIG. 11).

In this case, the insulating material includes only a resin. For example, an insulating layer prepared by laminating sublayers composed of a material in which a core material is impregnated with a resin can be used. In such a case, when the above-described machining is performed, the recess may not be easily flat. That is, when the recess is formed by machining, irregularities are formed because of the difference in the depth of the recess, the condition of the resin (since the core material is woven in the resin, the presence or the absence of the core material depends on positions), or the like. When the semiconductor device is accommodated in the recess, the presence of the irregularities causes a tilt of the semiconductor device. Accordingly, it may be difficult to ensure the connectivity between the electrode pads and via holes. In addition, when a resin not including a core material or the like is used for an insulating layer in which via holes are formed, it may be difficult to ensure the connection by the via holes.

Accordingly, in the present invention, side faces of the recess for accommodating a semiconductor device preferably form a tapered shape diverging from the bottom face upwards. According to such a structure, even when the semiconductor device accommodated in the recess is subjected to stress (for example, thermal stress or external stress) in the lateral direction, the stress can be relieved. Furthermore, this structure can suppress the phenomenon in which an adhesive, which is applied on the bottom face of the semiconductor device in order to fix the semiconductor device, flows along the side faces of the recess by capillary action. Consequently, the adhesiveness of the semiconductor device to the bottom of the recess can be easily ensured.

In the embodiment of the present invention, as shown in FIG. 1, the angle of the above taper is defined as an exterior angle formed by the side face and the bottom face of the recess. The taper angle is preferably at least 60 degrees and less than 90 degrees, and more preferably in the range of 60 to 85 degrees. At an angle within the above range, stress applied on the side face of the semiconductor device can be relieved, thereby suppressing the displacement of the semiconductor device. Therefore, during a reliability test, connection failure at via holes does not easily occur in the early stage.

In the embodiment of the present invention, two insulating resin substrates described above are used as the resin insulating layer for accommodating a semiconductor device. More specifically, the resin insulating layer includes a first insulating resin substrate in which a metal layer having dimensions corresponding to the dimensions of the semiconductor device is provided on one surface and a second insulating resin substrate that is laminated on the surface of the first insulating resin substrate, the surface having the metal layer. A recess for accommodating the semiconductor device is formed by laser machining on the other surface of the first insulating resin substrate so as to reach the metal layer. Thus, a substrate for accommodating a semiconductor in which the metal layer is exposed from the recess is formed. The exposed metal layer is installed in advance and has a substantially flat surface.

In another embodiment, a first insulating resin substrate in which a metal layer having dimensions corresponding to the dimensions of the semiconductor device is provided on one surface and a second insulating resin substrate in which an opening is provided in advance at an area corresponding to the metal layer may be laminated to form a recess in which one side of the opening is closed. Thus, a substrate for accommodating a semiconductor in which the metal layer is exposed from the recess may be formed.

In such an embodiment, each of the first insulating resin substrate and the second insulating resin substrate preferably has a thickness of about 20 to 250 μm. When the thickness is within this range, the insulating property of an interlayer insulating layer can be easily ensured, via holes for interlayer connection can be easily formed, and electrical connectivity can be easily ensured.

Each of the insulating resin substrates used may be a resin substrate including a single layer. Alternatively, the insulating resin substrate may be a multilayered resin substrate including two or more layers.

After the semiconductor device is embedded in the recess of the substrate for accommodating a semiconductor, an interlayer resin insulating layer is formed on at least one surface of the substrate for accommodating a semiconductor. Subsequently, a conductor circuit including via holes for establishing the electrical connection to the semiconductor device is formed on the interlayer resin insulating layer. Furthermore, other interlayer resin insulating layers and conductor circuits are then alternately laminated, thereby manufacturing the multilayered printed circuit board of the present invention.

As regards the semiconductor device embedded in the recess of the substrate for accommodating a semiconductor, either a semiconductor device in which columnar electrodes are provided in advance on connection pads of the device or a semiconductor device including an intermediate layer that covers connection pads can be used. Preferably, such a semiconductor device is electrically connected to the via holes provided in the interlayer resin insulating layer, with the columnar electrodes or the intermediate layer therebetween.

Methods for manufacturing (1) a semiconductor device having columnar electrodes and (2) a semiconductor device having an intermediate layer will be described below.

(1) Method for Manufacturing Semiconductor Device Having Columnar Electrodes

A semiconductor device that has columnar electrodes and that is used in an embodiment of the present invention means a semiconductor device having columnar electrodes or rewiring.

Figure 2:
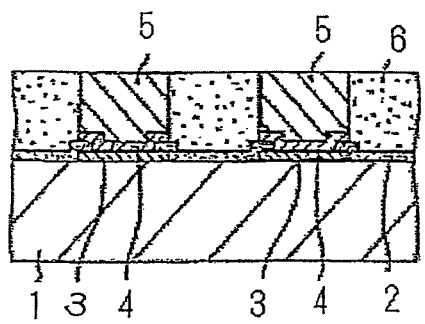
FIG. 2 is a schematic cross-sectional view showing a multilayered printed circuit board having columnar electrodes provided on pads of a semiconductor device according to the present invention.

As shown in FIG. 2, connection pads 2 composed of aluminum or the like are formed on a semiconductor device 1 (silicon substrate), which is in the form of a wafer. A protective layer (passivation film) 3 is formed on areas except for the central part of each connection pad 2. In this state, the surface of the connection pads 2 is exposed at their central part that is not covered with the protective layer 3.

A metal underlayer 4 is then formed on the entire surface of the semiconductor device 1. Chromium, copper, nickel, or the like can be used for the metal underlayer 4.

A plating resist layer composed of a liquid resist is then formed on the metal underlayer 4. Openings are formed in areas of the plating resist layer, the areas corresponding to the connection pads 2 of the semiconductor device 1.

Subsequently, electrolytic plating is performed using the metal underlayer 4 as a plating current path. Accordingly, columnar electrodes 5 are formed on the metal underlayer 4 disposed in the openings of the plating resist layer. The plating resist layer is then removed, and the unnecessary parts of the metal underlayer 4 are removed by etching using the columnar electrodes 5 as a mask. Accordingly, the metal underlayer 4 remains only under the columnar electrodes 5.

Furthermore, a sealing film 6 composed of an epoxy resin, a polyimide, or the like is formed on the surface semiconductor device 1. In this state, when the top surface of the columnar electrodes 5 is covered with the sealing film 6, the surface is appropriately polished so as to expose the top surface of the columnar electrodes 5. Next, a dicing process is performed to produce semiconductor chips (semiconductor devices having columnar electrodes).

(2) Method for Manufacturing Semiconductor Device Having Intermediate Layer

The intermediate layer used in an embodiment of the present invention means an intermediate layer for electrically connecting the semiconductor device to via holes provided on the pads of the semiconductor device.

Figure 3:
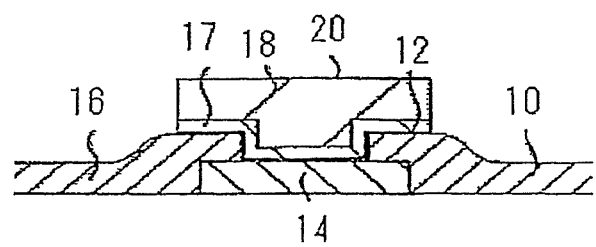
FIG. 3 is a schematic cross-sectional view showing a multilayered printed circuit board having an intermediate layer provided on pads of a semiconductor device according to the present invention.

As shown in FIG. 3, a conductive metal layer 12 (first thin-film layer) is formed on the entire surface of a semiconductor device 10 to be installed by vapor deposition, sputtering, or the like. The metal is preferably tin, chromium, titanium, nickel, zinc, cobalt, gold, copper, or the like. The first thin-film layer 12 is preferably formed so as to have a thickness in the range of about 0.001 to 2.0 μm. When the thickness is within this range, a metal layer having a uniform thickness over the entire surface can be easily formed, thus suppressing variations in the film thickness. When the first thin-film layer 12 is composed of chromium, the thickness is preferably about 0.1 μm.

A connection pad 14 is covered with the first thin-film layer 12 to increase the adhesiveness at the interface between an intermediate layer 20 and the connection pad 14 of the semiconductor device 10. Furthermore, by covering the connection pad 14 of the semiconductor device 10 with the above metal, intrusion of moisture into the interface can be prevented to prevent dissolution or corrosion of the connection pad 14. Accordingly, the reliability is not easily degraded.

Any one of chromium, nickel, and titanium is preferably used as the metal of the first thin-film layer 12 because satisfactory adhesiveness between the connection pad 14 and the first thin-film layer 12 can be achieved and the intrusion of moisture into the interface can be easily prevented.

A second thin-film layer 17 is then formed on the first thin-film layer 12 by sputtering, vapor deposition, or electroless plating. Nickel, copper, gold, silver, or the like is used for the second thin-film layer 17. From the standpoints of electrical characteristics, economical efficiency, and the fact that a thick layer formed in a subsequent step is primarily composed of copper, preferably, the second thin-film layer 17 is also composed of copper.

The reason for the formation of the second thin-film layer 17 is that it is difficult to obtain a plating lead used for electrolytic plating for forming the thick layer described below when only the first thin-film layer 12 is provided. The second thin-film layer 17 is used as the plating lead for forming the thick layer.

The thickness of the second thin-film layer 17 is preferably in the range of about 0.01 to 5.0 μm. When the thickness is within this range, the second thin-film layer 17 can function as the plating lead. In addition, during etching, the phenomenon in which the lower first thin-film layer 12 is excessively etched to form a clearance can be suppressed, and moisture is not easily intruded. Accordingly, the reliability can be easily ensured.

A metal thick layer is formed on the second thin-film layer 17 by electroless or electrolytic plating. Examples of the metal used for the thick layer include nickel, copper, gold, silver, zinc, and iron. From the standpoints of electrical characteristics, economical efficiency, the strength as an intermediate layer, the resistance in the structure, and the fact that a conductor layer of a build-up wiring layer, which is formed in a subsequent step, is primarily composed of copper, the thick layer is preferably formed by electrolytic copper plating.

The thickness of a thick electrolytic copper plating layer (thick layer) 18 is preferably in the range of about 1 to 20 µm. When the thickness is within this range, connection reliability with a via hole provided in the upper layer is not easily decreased. In addition, since undercut is not easily formed during etching, the generation of a clearance between the intermediate layer to be formed and the via hole can be suppressed. Alternatively, in some cases, the thick layer 18 may be formed directly on the first thin-film layer by plating. The thick layer 18 may be formed by laminating a plurality of layers.

An etching resist is then formed thereon. Exposure and development are then performed to expose the metal layer disposed in areas other than the intermediate layer. The exposed metal parts are then etched. Accordingly, the intermediate layer 20 including the first thin-film layer 12, the second thin-film layer 17, and the thick layer 18 is formed on the connection pad 14 of the semiconductor device.

In addition to the above-described method, the intermediate layer may be formed as follows. After a semiconductor device is installed in a recess of a substrate, the intermediate layer may be formed. Alternatively, a metal film is formed on a semiconductor device and a core substrate, and a dry film resist is then formed on the metal film. Subsequently, a part of the dry film resist disposed in areas corresponding to the intermediate layer is then removed. The thick layer is then formed by electrolytic plating. The remaining resist is removed, and the exposed metal film is then removed with an etchant. Thus, the intermediate layer may be formed on die pads of the semiconductor device.

Next, an example of a method for manufacturing a multilayered printed circuit board of the present invention will be described more specifically.

A. Preparation of Substrate for Accommodating Semiconductor Device

In producing a multilayered printed circuit board according to the present invention, a substrate prepared by laminating a first insulating resin substrate and a second insulating resin substrate in which a copper foil is applied on at least one side of the insulating resin substrate is used as a substrate for accommodating a semiconductor device, the substrate constituting the multilayered printed circuit board.

(1) The first insulating resin substrate can be formed from, for example, a double-sided copper clad laminate. A surface of such a double-sided copper clad laminate is irradiated with a laser beam to form openings for forming via holes. The openings penetrate through the surface of one of the copper foils of the first insulating resin substrate and the resin insulating layer and reach the other copper foil (or a conductor circuit pattern).

The laser irradiation is performed with a pulse oscillation-type carbon dioxide gas laser drilling machine. Regarding the processing conditions, the pulse energy is preferably in the range of about 0.5 to 100 mJ, the pulse width is preferably in the range of about 1 to 100 µs, the pulse interval is preferably in the range of about 0.5 ms or more, the frequency is preferably in the range of about 2,000 to 3,000 Hz, and the number of shots is preferably in the range of 1 to 5.

The diameter of the openings for forming via holes formed under the above conditions is preferably in the range of about 50 to 250 µm.

To form the openings for forming via holes in a copper clad laminate by laser irradiation, either a direct laser method in which laser irradiation is performed so that the openings are simultaneously formed in a copper foil and an insulating resin substrate or a conformal method in which a part of a copper foil corresponding to the openings for forming via holes is removed by etching in advance and an insulating resin substrate is then irradiated with a beam may be used.

(2) In order to remove resin residues remaining in the openings formed in the above step, a desmear process is preferably performed.

This desmear process is performed by a wet process such as a treatment with a chemical of an acid or an oxidant (e.g., chromic acid or permanganic acid) or a dry process such as an oxygen plasma discharge treatment, a corona discharge treatment, an ultraviolet laser treatment, or an excimer laser treatment.

The method of the desmear process is selected in accordance with the expected amount of residual smear that depends on the type and the thickness of insulating resin substrate used, the diameter of the via holes, laser conditions, and the like.

(3) Electrolytic copper plating is performed using the copper foil as a plating lead on the surface of the copper foil of the substrate that has been subjected to the desmear process. Accordingly, the openings are completely filled with copper formed by electrolytic plating to form filled vias.

Optionally, after the electrolytic copper plating, a part of the plated copper protruding from the top of the opening for forming the via holes of the substrate may be removed by belt sanding, buffing, etching, or the like to planarize the surface.

(4) A resist layer is then formed on either side of the first insulating resin substrate, and exposure and development are then performed. Subsequently, copper disposed on areas where the resist layer is not formed is etched with an etchant containing cupric chloride or the like, and the resist layer is then removed. Accordingly, a conductor circuit including via hole lands, a mark for positioning, and the like are formed on one surface of the first insulating resin substrate. A metal layer having dimensions corresponding to the dimensions of a semiconductor device, a conductor circuit including via hole lands, a mark for positioning, and the like are formed on the other surface of the first insulating resin substrate.

(5) A second insulating resin substrate is laminated on a surface of the first insulating resin substrate, the surface having the metal layer thereon.

For example, the second insulating resin substrate is prepared by laminating a copper foil on a prepreg, which is as an adhesive layer. The second insulating resin substrate is laminated on one surface of the first insulating resin substrate by thermocompression bonding to form a laminate.

(6) Laser irradiation is performed onto a surface of the first insulating resin substrate constituting the laminate, the surface having the metal layer, as in step (1) above. Accordingly, openings for forming via holes are formed. The openings penetrate through the surface of the copper foil of the second insulating resin substrate and the resin layer and reach the conductor circuit that is formed on the first insulating resin substrate and that includes the via hole lands.

Regarding the processing conditions for the openings for forming via holes, the pulse energy is preferably in the range of about 0.5 to 100 mJ, the pulse width is preferably in the range of about 1 to 100 μs, the pulse interval is preferably in the range of about 0.5 ms or more, the frequency is preferably in the range of about 2,000 to 3,000 Hz, and the number of shots is preferably in the range of 1 to 10.

The diameter of the openings for forming via holes formed under the above processing conditions is preferably in the range of about 50 to 150 μm. When the diameter of the openings is within this range, interlayer connectivity can be easily ensured and a high-density wiring can be easily achieved.

(7) In order to remove resin residues remaining in the openings for forming via holes formed in step (6), a desmear process is performed as in step (2).

(8) The surface of the first insulating resin substrate is covered with a protective film, and electrolytic copper plating is then performed using the copper foil as a plating lead on the surface of the copper foil of the substrate that has been subjected to the desmear process. Accordingly, the openings are completely filled with copper formed by electrolytic plating to form filled vias.

Optionally, after the electrolytic copper plating, a part of the plated copper protruding from the top of the opening for forming the via holes of the substrate may be removed by belt sanding, buffing, etching, or the like to planarize the surface.

Alternatively, electroless plating may be performed in advance, and electrolytic plating may then be performed. In such a case, a metal such as copper, nickel, or silver may be used for the film formed by the electroless plating.

(9) A resist layer is formed on the copper film formed by electrolytic plating. The resist layer may be formed by applying a liquid resist and then curing the resist or applying a dry film resist. A mask including a circuit pattern is disposed on the resist layer. Exposure and development are then performed to form an etching resist layer. The metal layer disposed at areas where the etching resist layer is not formed is etched to form a conductor circuit including via hole lands. The protective film applied in step (8) is then removed.

The etchant used in the above etching is preferably at least one aqueous solution selected from aqueous solutions of sulfuric acid/hydrogen peroxide, persulfates, cupric chloride, and ferric chloride.

In order to easily form a fine pattern, as a preliminary treatment for forming the conductor circuit by etching the copper foil, the thickness of the copper foil may be adjusted in advance by etching the entire surface thereof.

The via hole lands, which are a part of the conductor circuit, are preferably formed so that the inner diameter of the via hole lands is substantially the same as the diameter of the via holes, or the outer diameter thereof is larger than the diameter of the via holes. The land diameter is preferably in the range of about 75 to 350 μm.

(10) Subsequently, an opening penetrating through the resin layer and reaching the surface of the metal layer is formed by, for example, laser machining on a surface area (area for accommodating a semiconductor device) of the first insulating resin substrate, the surface area being disposed at the side opposite the metal layer. Accordingly, a recess is formed so that the surface of the metal layer is exposed from the opening, thus forming the substrate for accommodating a semiconductor device. As required, the recess on which the metal layer is exposed may be formed by forming a resist layer, and then performing an etching process.

For example, an opening penetrating through the surface of the first insulating resin substrate and the resin layer and reaching the surface of the metal layer is formed on the laminate including the first insulating resin substrate and the second insulating resin substrate by laser irradiation with a pulse oscillation-type carbon dioxide gas laser drilling machine. Thus, a recess for accommodating or installing a semiconductor device is formed.

Regarding the processing conditions for forming the recess that accommodates a semiconductor device, the pulse energy is preferably in the range of about 0.5 to 100 mJ, the pulse width is preferably in the range of about 1 to 100 μs, the pulse interval is preferably in the range of about 0.5 ms or more, the frequency is preferably in the range of about 2,000 to 3,000 Hz, and the number of shots is preferably in the range of 1 to 10.

The recess for installing a semiconductor device is formed by such laser machining, and the metal layer (in this case, copper foil) is exposed on the bottom face of the recess. In this case, the metal layer has a shiny surface and a substantially flat surface. According to need, the surface of the metal layer may be roughened to some degree by a blackening treatment or the like. Thereby, the adhesiveness to the adhesive layer may be ensured.

B. Accommodation and Embedding of Semiconductor Device

(11) A semiconductor device is embedded in the substrate for accommodating a semiconductor device produced in steps (1) to (10) of process A above.

As described above, either a semiconductor device in which columnar electrodes are provided in advance on connection pads or a semiconductor device including an intermediate layer that covers connection pads can be used as the semiconductor device to be embedded. Here, a description will be made of the case where the latter semiconductor device is used.

This intermediate layer is provided in order to directly connect the pads of the semiconductor device to the conductor circuit including via holes of the printed circuit board. The intermediate layer is formed by forming a thin-film layer on die pads, and further forming a thick layer on the thin-film layer. The intermediate layer preferably includes at least two metal layers.

The dimensions of the intermediate layer are preferably larger than the dimensions of the die pads of the semiconductor device. In such a case, positional alignment with the die pads can be easily performed. Consequently, electrical connectivity with the die pads can be improved, and processes for forming via holes by laser irradiation and photo-etching can be performed without damaging the die pads. Accordingly, embedding and accommodation of the semiconductor device in the printed circuit board, and electrical connection between the semiconductor device and the printed circuit board can be reliably performed.

Furthermore, a metal layer constituting a conductor circuit of the printed circuit board can be directly formed on the intermediate layer.

In addition to the above-described method, the intermediate layer can be manufactured by the following method. A metal layer is formed on an entire surface of the semiconductor device, the surface having the connection pads, or a metal layer is formed on the substrate for accommodating a semiconductor device in which the semiconductor device is embedded. A dry film resist is formed on the metal layer, and a part of the resist disposed at areas corresponding to the intermediate layer is then removed. Subsequently, a thick layer is formed by electrolytic plating. The remaining resist is removed, and the exposed metal layer is then removed with an etchant. Thus, the intermediate layer can be formed on the connection pads of the semiconductor device.

(12) A resin insulating layer is formed on the substrate accommodating and installing the semiconductor device, and steps the same as steps (1) to (4) of process A are then performed. Accordingly, via holes that are electrically connected to the intermediate layer formed on connection pads of the installed semiconductor device, via holes that are electrically connected to the conductor circuit including via holes and formed on the substrate for accommodating the semiconductor device, and the external conductor circuit can be formed. In this step, a matte treatment may be performed on the conductor circuit and the metal layer on the substrate. Techniques for forming a matte surface by roughening the surface of the metal layer, such as etching, plating, an oxidation-reduction treatment, and a blackening treatment, can be used for the matte treatment.

Furthermore, a resin insulating layer and a copper foil are laminated, and steps the same as steps (1) to (4) of process A are repeated. Accordingly, a printed circuit board including further laminated layers can be produced.

In the above method, resin insulating layers are laminated by sequentially laminating a resin insulating layer. Alternatively, according to need, two or more circuit boards each including a single resin insulating layer may be laminated and then subjected to thermocompression bonding at one time. Thus, resin insulating layers may be laminated to form a multilayered printed circuit board.

(13) Next, a solder resist layer is formed on each outer surface of the outermost circuit boards. In this step, a solder resist composition is applied on the entire outer surface of the circuit boards, and the resist film is then dried. A photomask film having a pattern of openings of solder pads is disposed on the resist film, and exposure and development are then performed. Accordingly, solder-pad openings in which conductive pad areas located directly on the via holes of the conductor circuit are exposed are formed. Alternatively, the openings may be formed by applying a dry film resist serving as the solder resist layer, and exposing and developing the resist or by machining the resist with a laser.

A corrosion-resistant layer composed of, for example, a nickel/gold layer is formed on the solder pads exposed on the areas where the mask layer is not formed. The thickness of the nickel layer is preferably in the range of about 1 to 7 μm, and the thickness of the gold layer is preferably in the range of about 0.01 to 0.1 μm.

Alternatively, a nickel/palladium/gold layer, a gold layer (single layer), a silver layer (single layer), or the like may be formed. After the corrosion-resistant layer is formed, the mask layer is removed. Accordingly, a printed circuit board including solder pads having the corrosion-resistant layer and solder pads that do not have the corrosion-resistant layer is prepared.

(14) Solder is supplied to the solder pad areas exposed directly on the via holes from the openings of the solder resist prepared in step (13). The solder is then melted and solidified to form a multilayered printed circuit board having a solder layer thereon. Alternatively, solder bumps, conductive balls, or conductive pins may be bonded on the pad areas, with a conductive adhesive or a solder layer therebetween.

In a solder transferring method, a solder foil is bonded on a prepreg, and the solder foil is then etched so that the solder remains in only areas corresponding to solder-resist openings to form a solder pattern. Thus, a solder carrier film is prepared. A flux is applied on the solder-resist openings of a substrate. The solder carrier film is then laminated on the substrate so that the solder pattern is in contact with pads, and the solder is then transferred by heating.

On the other hand, in a printing method, a printing mask (metal mask) in which openings are provided at positions corresponding to pads is disposed on a substrate. Solder paste is printed on the mask and is then heated. For example, Sn/Ag solder, Sn/In solder, Sn/Zn solder, or Sn/Bi solder can be used as solder for forming such a solder layer.

Example 1

(1) Preparation of Substrate

First, a printed circuit board constituting a substrate for accommodating a semiconductor device is prepared. This printed circuit board includes a first insulating substrate 30 and a second insulating substrate 40 and is formed by laminating these substrates. An example of the starting material of the printed circuit board is a double-sided copper clad laminate prepared by laminating a copper foil on a B-stage prepreg in which a glass cloth is impregnated with an epoxy resin, and then pressing the laminate under heating.

A double-sided copper clad laminate is used as the first insulating substrate 30. In the double-sided copper clad laminate, a copper foil 34 having a thickness of 15 μm is bonded on the top face and the bottom face of a resin insulating layer 32 having a thickness of 100 μm. The copper foil 32 of the copper clad laminate may have a thickness of more than 15 μm. In such a case, the thickness of the copper foil may be adjusted to 15 μm by etching (see FIG. 4A).

A metal layer, which constitutes a bottom face of a recess for installing a semiconductor device, a conductor circuit, and the like are formed by photolithography including a resist formation and an etching process on a surface of the first insulating substrate 30, the surface to be in contact with the second insulating substrate 40, as described below. A mark for positioning during laser perforation and the like may also be formed according to need.

(2) Formation of Openings for Forming Via Holes

A surface of one of the copper foils of the first insulating substrate 30 is irradiated with a carbon dioxide gas laser to form openings 36 for forming via holes. The openings 36 penetrate through the copper foil 34 and the resin insulating layer 32 and reach a surface of the other copper foil 34 (see FIG. 4B). Furthermore, a desmear process is then performed for the openings 36 using a solution of permanganic acid.

In this example, the openings 36 for forming via holes are formed as follows with a high-peak short-pulse oscillation-type carbon dioxide gas laser drilling machine manufactured by Hitachi Via Engineering, Ltd. A laser beam is directly irradiated onto the copper foil 34 provided on the resin insulating layer (glass-cloth epoxy resin substrate) having a substrate thickness of 60 μm under the following irradiation conditions. The openings 36 for forming via holes each have a diameter of 75 μm and are formed at a rate of 100 openings/second.

(Irradiation Conditions)
Pulse energy: 75 mJ
Pulse width: 80 μs
Pulse interval: 0.7 ms
Frequency: 2,000 Hz (3) Formation of Electrolytic Copper Plating Film After the desmear process, electrolytic copper plating is performed on the surface of the copper foil of the first insulating substrate 30 on which the openings 36 for forming via holes are provided using the copper foil as a plating lead. The plating conditions are as follows.

[Electrolytic Plating Solution]
Sulfuric acid: 2.24 mol/L
Copper sulfate: 0.26 mol/L
Additive A (reaction accelerator): 11.0 mL/L
Additive B (reaction inhibitor): 10.0 mL/L
[Conditions for Electrolytic Plating]
Current density: 1 A/dm$^2$
Time: 65 minutes
Temperature: 22° C.±2° C.

According to the above plating process, the formation of an electrolytic copper plating film 38 in the openings is accelerated by the additive A. On the other hand, the additive B is mainly adhered to the copper foil part, and the formation of the plated film is suppressed. When the openings are filled with the electrolytic copper plating film and the height thereof substantially becomes the same as that of the copper foil, the additive B is adhered to the copper plating film and the formation of the plated film is suppressed as in the copper foil part. Accordingly, the openings are completely filled with the electrolytic copper plating film, and the electrolytic copper plating film 38 exposed from the openings and the copper foil 34 substantially form a flat surface (see FIG. 4C).

The thickness of a conductor layer composed of the copper foil 34 and the electrolytic copper plating film 38 may be adjusted by etching. The thickness of the conductor layer may be adjusted by a physical method, such as belt sanding or buffing, as required.

(4) Formation of Conductor Circuit, Filled Vias, and Metal Layer

After step (3), an etching resist layer (not shown) is formed on each copper foil 34 of the first insulating substrate 30 and the electrolytic copper plating film 38 using a photosensitive dry film. That is, the etching resist layer is formed on each copper foil 34 disposed on the top face and the bottom face of the first insulating substrate 30. The thickness of each resist layer is in the range of 15 to 20 μm. The resist layers are exposed using masks having a pattern of a conductor circuit including lands of filled vias and a pattern of a metal layer having dimensions corresponding to the dimensions of a semiconductor device, and then developed. Accordingly, areas that do not have the resist layer thereon are formed on the copper foils.

Subsequently, the electrolytic copper plating film 38 and the copper foil 34 on the above areas that do not have the resist layer are removed by etching with an etchant composed of aqueous hydrogen peroxide and sulfuric acid.

The resist layers are then removed by an alkaline solution. Accordingly, conductor circuits 41 including lands of filled vias 39, and a metal layer 42 with which a semiconductor device is brought into contact are formed. A dummy pattern, an alignment mark, a product identification code, and the like may also be formed according to need.

Consequently, a circuit board in which the conductor circuit 41 is formed on each of the top face and the bottom face of the first insulating substrate 30 and which has filled vias 39 that electrically connected these conductor circuits 41, and the metal layer 42 for accommodating a semiconductor device thereon is prepared.

As shown in FIG. 1, the metal layer 42 formed on the circuit board is provided on the reverse face of the first insulating substrate, and the copper foil part on the surface of the circuit board, the part corresponding to the area where a recess for accommodating a semiconductor device is formed, is removed by etching (see FIG. 4D).

(5) Lamination of First Insulating Substrate and Second Insulating Substrate

As shown in FIG. 4E, a single-sided copper clad laminate is used as the second insulating substrate 40 laminated on the first insulating substrate 30. In the single-sided copper clad laminate, a copper foil 44 having a thickness of 15 μm is bonded on a surface of a resin insulating layer 43 having a thickness of 60 μm.

The second insulating substrate 40 is laminated on the first insulating substrate 30 so that the surface that does not have the copper foil 44 is in contact with the surface having the metal layer 42 of the first insulating substrate 30 (the metal layer 42 functions as a metal layer for accommodating a semiconductor device thereon). The first insulating substrate 30 is laminated on the second insulating substrate 40 by thermocompression bonding under the following conditions (see FIG. 4E). In this step, a treatment for forming a matte surface (for example, the formation of a roughened surface by etching) may be performed on the conductor circuit 41 and the metal layer 42.

(Conditions for Thermocompression)
Temperature: 180° C.
Pressure during pressing: 150 kgf/cm$^2$
Time of compression bonding: 15 minutes In this embodiment, each of the first insulating substrate 30 and the second insulating substrate 40 is composed of a single layer. Alternatively, each of these substrates may be composed of two or more layers.

(6) Formation of Openings for Forming Via Holes

The surface of the copper foil 44 of the second insulating substrate 40 is irradiated with a carbon dioxide gas laser to form openings 46 for forming via holes. The openings 46 penetrate through the copper foil 44, pass the resin insulating layer 43, and reach the surface of the conductor circuit 41 including via lands of the filled vias 39 provided on the first insulating substrate 30 (see FIG. 4F). Furthermore, a desmear process is then performed for the openings 46 using a solution of permanganic acid.

In this example, in order to form the openings 46 for forming via holes in the second insulating substrate 40, a high-peak short-pulse oscillation-type carbon dioxide gas laser drilling machine manufactured by Hitachi Via Engineering, Ltd. is used. A laser beam is directly irradiated onto the copper foil 44 provided on the glass-cloth epoxy resin substrate 43 with a substrate thickness of 60 μm of the second insulating substrate 40 under the following irradiation conditions. The openings 46 for forming via holes each have a diameter of 75 μm and are formed at a rate of 100 openings/second.

(Irradiation Conditions)
Pulse energy: 75 mJ
Pulse width: 80 μs
Pulse interval: 0.7 ms
Frequency: 2,000 Hz (7) Formation of Electrolytic Copper Plating Film The surface of the first insulating substrate 30 is covered with a protective film 48. Electrolytic copper plating is then performed on the surface of the copper foil of the second insulating substrate 40 in which the openings 46 have been subjected to the desmear process, using the copper foil as a plating lead. The plating conditions are as follows.
[Electrolytic Plating Solution]
Sulfuric acid: 2.24 mol/L
Copper sulfate: 0.26 mol/L
Additive A (reaction accelerator): 11.0 mL/L
Additive B (reaction inhibitor): 10.0 mL/L
[Conditions for Electrolytic Plating]
Current density: 1 A/dm$^2$
Time: 65 minutes
Temperature: 22° C.±2° C.

In this plating process, the formation of an electrolytic copper plating film in the openings is accelerated by the additive A. On the other hand, the additive B is mainly adhered to the copper foil part, and the formation of the plated film is suppressed. When the openings are filled with the electrolytic copper plating film and the height thereof substantially becomes the same as that of the copper foil, the additive B is adhered to the copper plating film and the formation of the plated film is suppressed as in the copper foil part. Accordingly, the openings are completely filled with the electrolytic copper plating film, and the electrolytic copper plating film exposed from the openings and the copper foil substantially form a flat surface.

The thickness of a conductor layer composed of the copper foil and the electrolytic copper plating film may be adjusted by etching. The thickness of the conductor layer may be adjusted by a physical method, such as belt sanding or buffing, as required.

(8) Formation of Conductor Circuit and Filled Vias

After step (7), an etching resist layer (not shown) was formed on the copper foil 44 of the second insulating substrate 40 and the electrolytic copper plating film using a photosensitive dry film. The thickness of the resist layer is in the range of 15 to 20 μm. The resist layer is exposed using a mask having a pattern of a conductor circuit including lands of filled vias, and then developed. Accordingly, areas that do not have the resist layer thereon are formed on the copper foil.

Subsequently, the electrolytic copper plating film and the copper foil 44 on the above areas that do not have the resist layer are removed by etching with an etchant composed of aqueous hydrogen peroxide and sulfuric acid.

The resist layer is then removed by an alkaline solution. Furthermore, the protective film 48 applied on the surface of the first insulating substrate 30 in step (7) is removed. Accordingly, a conductor circuit 50 is formed on a surface of the second insulating substrate 40. Filled vias 52 that electrically connect the conductor circuit to the lands 41 of the filled vias 39 provided on the first insulating substrate 30 are also formed (see FIG. 4G). A dummy pattern, an alignment mark, a product identification code, and the like may also be formed according to need.

(9) Formation of Recess for Accommodating Semiconductor Device

Figure 5A:
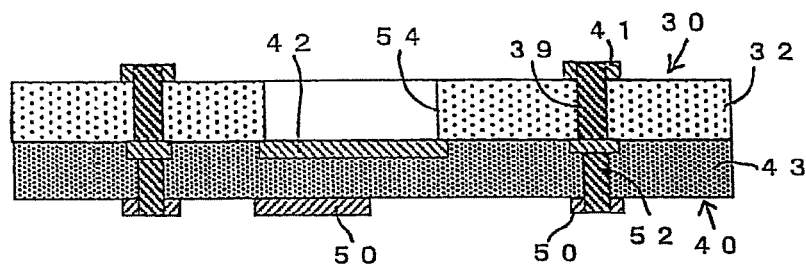
FIGS. 5A to 5D are schematic cross-sectional views showing some steps of manufacturing the multilayered printed circuit board according to Example 1 of the present invention.

The resin area where the copper foil part has been removed by etching in step (4) is irradiated with a carbon dioxide gas laser to form an opening penetrating through the resin insulating layer 32 and reaching the surface of the metal layer 42. The metal layer is exposed in the opening, and the side faces of the opening and the surface of the metal layer (serving as a bottom face) form a recess 54 for installing a semiconductor device 55 (see FIG. 5A).

In this example, in order to form the recess 54 for accommodating a semiconductor device in the first insulating substrate 30, a high-peak short-pulse oscillation-type carbon dioxide gas laser drilling machine manufactured by Hitachi Via Engineering, Ltd. is used. A laser beam is irradiated under the following irradiation conditions onto the glass-cloth epoxy resin substrate with a substrate thickness of 60 μm of the first insulating substrate, more specifically, onto the area where the copper foil on the surface of the first insulating substrate has been removed. Accordingly, the recess 54 for accommodating a semiconductor device is formed. The recess 54 has a depth of about 100 μm and dimensions slightly larger than the dimensions of the semiconductor device to be accommodated.
(Irradiation Conditions)
Pulse energy: 100 mJ
Pulse width: 90 μs
Pulse interval: 0.7 ms
Frequency: 2,000 Hz Regarding the recess 54 for accommodating a semiconductor device formed by laser machining, the metal layer 42 was exposed on the bottom face, the recess 54 had a substantially uniform depth, and the four corners of the recess 54 did not have an arch shape. The surface of the metal layer on which the semiconductor device is placed is a shiny surface. According to need, however, the surface of the metal layer may be roughened to some degree by a blackening treatment or the like. Thereby, the adhesiveness to an adhesive layer may be ensured.

Furthermore, the area of the recess is smaller than the area of the metal layer. Therefore, the depth of the recess can be easily made uniform.

(10) Accommodation of Semiconductor Device Having Columnar Electrodes

A semiconductor device having columnar electrodes that is produced by the following steps (a) to (d) is used as the semiconductor device 55 accommodated and installed in the recess 54 of the substrate for accommodating a semiconductor device, which is produced in steps (1) to (9) above.
(a) Preparation of Silicon Substrate The following silicon substrate is prepared. Connection pads are formed on a silicon substrate (semiconductor substrate), which is in the form of a wafer. A protective layer (passivation film) is formed on areas except for the central part of each connection pad, and the central part of each connection pad is exposed on the opening provided on the protective layer.
(b) Formation of Metal Underlayer A metal underlayer composed of copper is then formed on the entire top surface of the silicon substrate by sputtering so as to have a thickness of 2 μm.
(c) Formation of Columnar Electrodes A dry film resist composed of a photosensitive resin such as an acrylic resin is laminated on the metal underlayer to form a plating resist layer having a thickness of 110 μm. The height of columnar electrodes to be formed is set to about 100 μm.

The plating resist layer is then exposed using a mask having a pattern of openings disposed at areas corresponding to pads of the plating resist layer, and developed. Accordingly, openings are formed on the resist.

Furthermore, electrolytic copper plating is performed using the metal underlayer as a plating current path. Accordingly, columnar electrodes composed of copper are formed on the copper underlayer disposed in the openings of the plating resist layer.

Finally, the plating resist layer is removed, and the unnecessary parts of the metal underlayer are removed by etching using the columnar electrodes as a mask. Accordingly, the metal underlayer remains only under the columnar electrodes.

(d) Formation of Sealing Film

A sealing film composed of an insulating resin such as an epoxy resin, a polyimide, or the like is formed on the top surface of the silicon substrate prepared in step (c). In this state, when the top surface of the columnar electrodes is covered with the sealing film, the surface is appropriately polished so as to expose the top surface of the columnar electrodes.

Next, a dicing process is performed to produce semiconductor chips (semiconductor devices). In this case, the semiconductor device having the columnar electrodes has a thickness of 100 µm.

A thermosetting adhesive, for example, an adhesive composed of a thermosetting resin produced by acrylating a part of an epoxy resin is applied on the bottom face of the semiconductor device 55 produced in steps (a) to (d) to form an adhesive layer 56 having a thickness in the range of 30 to 50 µm.

Figure 5B:
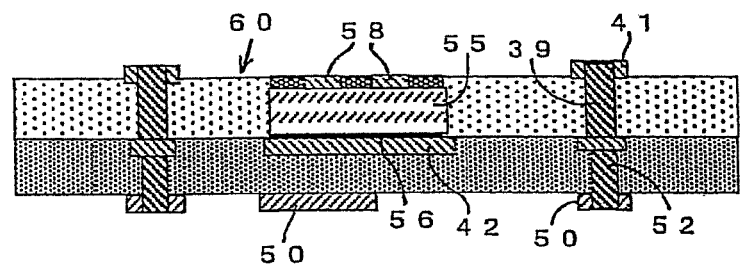

Subsequently, the semiconductor device 55 was accommodated in the recess 54 of the substrate for accommodating a semiconductor device, and a heat treatment was then performed at 100° C. to 200° C. to cure the adhesive layer 56. Accordingly, a substrate 60 including the semiconductor device 55 therein is produced (see FIG. 5B).

In this case, the leading end of columnar electrodes 58 of the semiconductor device and the top face of the substrate are substantially on the same level. That is, the semiconductor device 55 is not tilted and electrode pads are also flat.

(11) Lamination Process

Figure 5C:
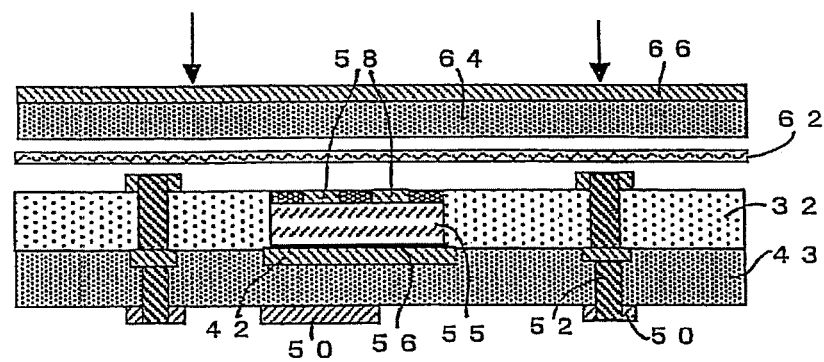
Figure 5D:
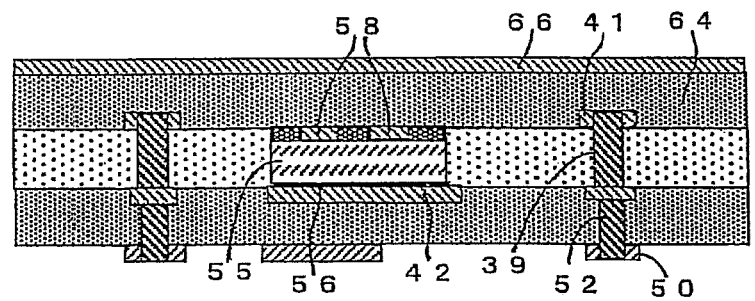

An adhesive layer 62 such as a prepreg is disposed on the substrate 60 produced in step (10). Furthermore, a single-sided copper clad laminate in which a copper foil 66 having a thickness of 15 µm is bonded on a surface of a resin insulating layer 64 having a thickness of 60 µm is laminated on the adhesive layer 62 (see FIG. 5C). Hot press is then performed in the direction shown by the arrows under the following conditions. Accordingly, a multilayered substrate is formed (see FIG. 5D).

(Conditions for Pressing)
Temperature: 190° C.
Pressure: 3.0 kgf/cm²
Pressing time: 35 minutes

(12) Formation of Openings for Forming Via Holes

Figure 6A:
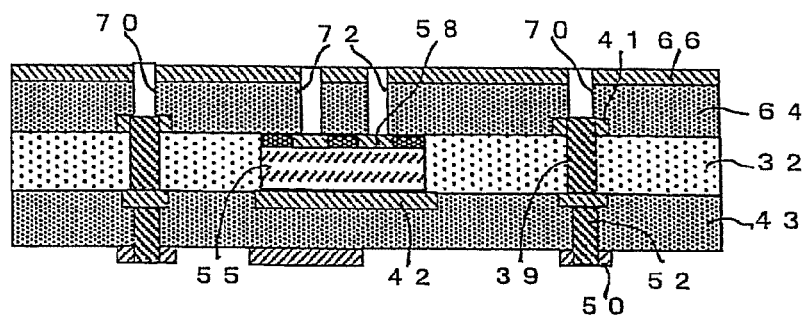
FIGS. 6A to 6D are schematic cross-sectional views showing some steps of manufacturing the multilayered printed circuit board according to Example 1 of the present invention.
Figure 6B:
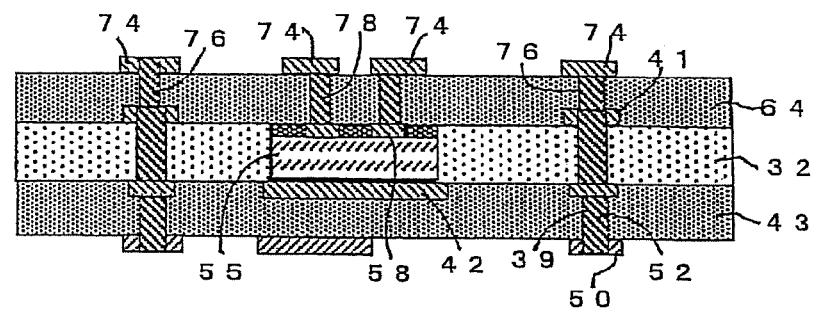
Figure 6C:
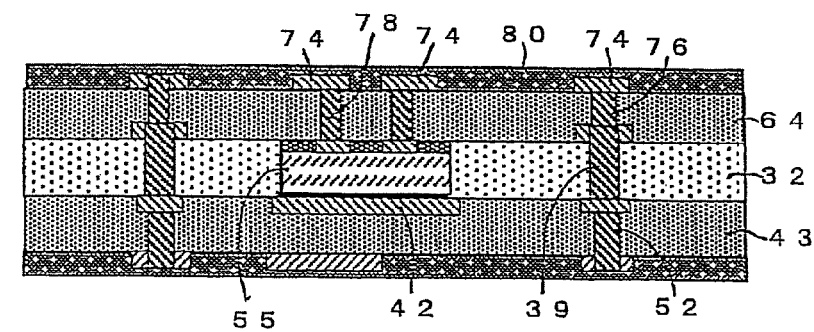
Figure 6D:
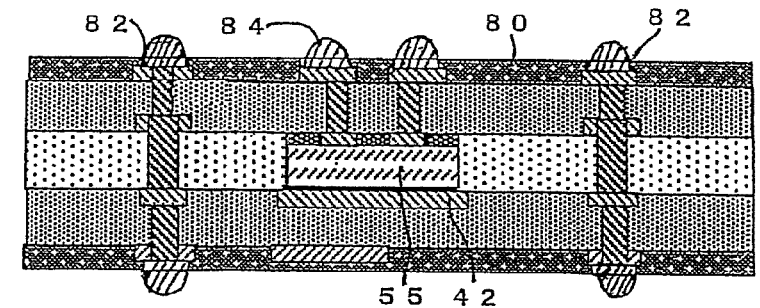

Openings 70 and 72 for forming via holes are formed as in step (6). The openings 70 penetrate through a copper foil 66, pass a resin insulating layer 64, and reach the conductor circuit 41 that includes via lands and that is provided on the first insulating substrate constituting the substrate for accommodating a semiconductor device. The openings 72 penetrate through the copper foil 66, pass the resin insulating layer 64, and reach the columnar electrodes 58 provided on the pads on the semiconductor device (see FIG. 6A). The conditions for laser irradiation in this step are the same as those in step (6). Furthermore, a desmear process is then performed for the openings using a solution of permanganic acid.

(13) Formation of Electrolytic Copper Plating Film

Electrolytic copper plating is performed on the surface of the copper foil wherein the openings have been subjected to the desmear process, using the copper foil as a plating lead under the following plating conditions.

[Electrolytic Plating Solution]
Sulfuric acid: 2.24 mol/L
Copper sulfate: 0.26 mol/L
Additive A (reaction accelerator): 10.0 mL/L
Additive B (reaction inhibitor): 10.0 mL/L
[Conditions for Electrolytic Plating]
Current density: 1 A/dm²
Time: 65 minutes
Temperature: 22° C.±2° C.

In this plating process, the formation of an electrolytic copper plating film in the openings is accelerated by the additive A. On the other hand, the additive B is mainly adhered to the copper foil part, and the formation of the plated film is suppressed. When the openings are filled with the electrolytic copper plating film and the height thereof substantially becomes the same as that of the copper foil, the additive B is adhered to the copper plating film and the formation of the plated film is suppressed as in the copper foil part. Accordingly, the openings are completely filled with the electrolytic copper plating film, and the electrolytic copper plating film exposed from the openings and the copper foil substantially form a flat surface.

The thickness of a conductor layer composed of the copper foil and the electrolytic copper plating film may be adjusted by etching. The thickness of the conductor layer may be adjusted by a physical method, such as belt sanding or buffing, as required.

Accordingly, the openings are completely filled with electrolytic copper plating film to form via holes connected to the conductor circuit and via holes connected to the host of the semiconductor device.

(14) Formation of Conductor Circuit

After step (13), an etching resist layer is formed on the copper foil and the electrolytic copper plating film using a photosensitive dry film. The thickness of the resist layer is in the range of 15 to 20 µm. The resist layer is exposed using a mask having a pattern of a conductor circuit including lands of filled vias and then developed. Accordingly, areas that do not have the resist layer thereon are formed on the copper foil.

Subsequently, the electrolytic copper plating film and the copper foil on the above areas that do not have the resist layer are removed by etching with an etchant composed of aqueous hydrogen peroxide and sulfuric acid.

The resist layer is then removed by an alkaline solution. Accordingly, a conductor circuit 74 is formed on the resin insulating layer 64 covering the substrate for accommodating a semiconductor device, and filled vias 76 that electrically connect the conductor circuit 74 to the lands 41 of the filled vias provided on the substrate 60 including the semiconductor device 55 and filled vias 78 that are electrically connected to the columnar electrodes 58 provided on the pads of the semiconductor device 55 are formed. A dummy pattern, an alignment mark, a product identification code, and the like may also be formed according to need.

Furthermore, by repeating steps (11) to (14) as required, a multilayered printed circuit board including more layers can be produced.

In such a lamination, the substrates may be laminated so that the directions of via holes are the same. Alternatively, the substrates may be laminated so that the directions of via holes are opposite to each other. The lamination may be performed in combinations other than these combinations.

(15) Formation of Solder Resist Layer

A solder resist layer 80 is formed on each outer surface of the top circuit board and the bottom circuit board of the multilayered substrate produced in steps (1) to (14). The solder resist layer 80 having a thickness in the range of 20 to 30 μm is formed by applying a solder resist film or applying a solder resist with varnish whose viscosity is adjusted in advance.

The multilayered substrate is then dried at 70° C. for 20 minutes and 100° C. for 30 minutes. A soda-lime glass substrate that has a thickness of 5 mm and a chromium layer having a circular pattern (mask pattern) of openings of the solder resist is prepared. The solder resist layer 80 is then exposed by irradiation of ultraviolet rays of 1,000 mJ/cm$^2$ while the soda-lime glass substrate is disposed so that the surface having the chromium layer is in contact with the solder resist layer 80. Subsequently, a DMTG development process is performed. The multilayered substrate is then heated at 120° C. for one hour and at 150° C. for three hours to form the solder resist layer 80 (thickness: 20 μm) having openings 82 (opening diameter: 200 μm) corresponding to the pad areas.

According to need, a roughened layer may be provided on each outer surface of the top circuit board and the bottom circuit board of the multilayered substrate prior to the formation of the solder resist layer 80.

In this case, a dry film mask layer composed of a photosensitive resin is formed on the solder resist layer. The mask layer having a thickness in the range of 10 to 20 μm is formed on the solder resist layer by applying a mask layer film or applying a mask layer with varnish whose viscosity is adjusted in advance.

The multilayered substrate is then dried at 80° C. for 30 minutes. A soda-lime glass substrate that has a thickness of 5 mm and a chromium layer having a formation pattern (mask pattern) of the mask layer is prepared. Exposure is then performed by irradiation of ultraviolet rays of 800 mJ/cm$^2$ while the soda-lime glass substrate is disposed so that the surface having the chromium layer is in contact with the solder resist layer. Subsequently, a DMTG development process is performed. The multilayered substrate is then heated at 120° C. for one hour to form the solder resist layer (thickness: 20 μm).

(16) Formation of Corrosion-Resistant Layer

Next, the multilayered substrate having the solder resist layers 80 is immersed in an electroless nickel plating solution (pH=5) containing 30 g/L of nickel chloride, 10 g/L of sodium hypophosphite, and 10 g/L of sodium citrate for 20 minutes. Accordingly, a nickel plating layer having a thickness of 5 μm is formed on the openings.

Furthermore, the multilayered substrate is then immersed in an electroless gold plating solution containing 2 g/L of potassium gold cyanide, 75 g/L of ammonium chloride, 50 g/L of sodium citrate, and 10 g/L of sodium hypophosphite at 93° C. for 23 seconds. Accordingly, a gold plating layer having a thickness of 0.03 μm is formed on the nickel plating layer, thus forming a coating metal layer (not shown) including the nickel plating layer and the gold plating layer.

(17) Formation of Solder Layer

Subsequently, solder paste composed of Sn/Ag/Cu or Sn/Pb solder that has a melting point of about 183° C. is printed on solder pads exposed on the openings 82 of the solder resist layer 80 covering the top layer of the multilayered circuit board and ref lowed at 183° C. to form a solder layer 84.

Example 2

A multilayered printed circuit board was produced as in Example 1 except that a semiconductor device 55 that had an intermediate layer and that was produced by the following steps (a) to (c) was embedded in the recess 42 of the substrate for accommodating a semiconductor device.

(a) A chromium thin-film layer having a thickness of 0.1 μm and a copper thin-film layer having a thickness of 0.5 μm are continuously formed in that order by sputtering in a vacuum chamber on the entire surface of a semiconductor device in which a protective layer is provided on connection pads and a wiring pattern.

(b) A resist layer composed of a dry film is then formed on the thin-film layer. A mask having a pattern of the intermediate layer to be formed is disposed on the resist layer, and the resist layer is then exposed. The resist layer is then developed to form areas that do not have the resist layer thereon. A thick layer (electrolytic copper plating film) having a thickness of 10 μm is formed by electrolytic copper plating on the areas that do not have the resist layer thereon.

(c) The plating resist layer is then removed by an alkaline solution or the like. The metal film disposed under the plating resist layer is removed with an etchant to form an intermediate layer on the pads of the semiconductor device.

Accordingly, a semiconductor device having a length of 5 mm, a width of 5 mm, and a thickness of 100 μm is produced.

Example 3

A multilayered printed circuit board is produced as in Example 1 except that a taper is formed on the side faces of the recess for accommodating a semiconductor device in step (9). In this case, in step (11) above, a part of the prepreg-containing resin insulating layer that covers the semiconductor device accommodated in the recess fills the clearance between the side faces of the semiconductor device and the side walls of the recess. Accordingly, the resin insulating layer is integrated with an adhesive layer that fixes the semiconductor device on the bottom face of the recess.

Figure 7:
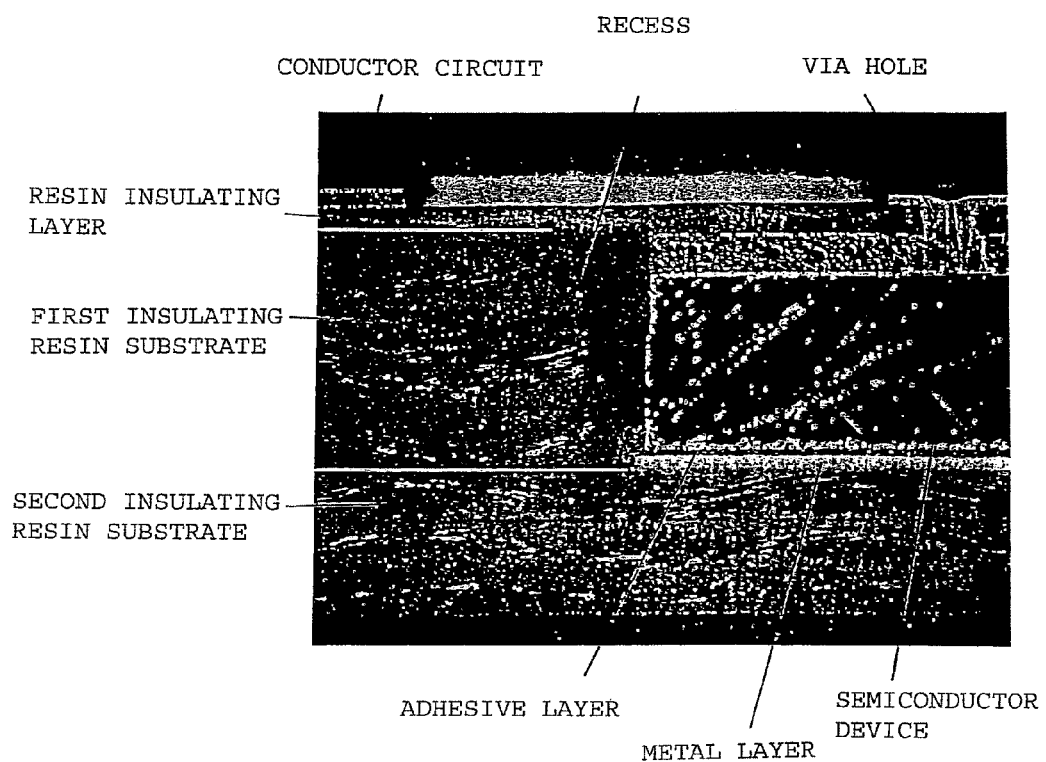
FIG. 7 is a SEM image showing a cross section of the relevant part of a multilayered printed circuit board according to Example 3 of the present invention.

FIG. 7 is an example of a SEM image showing a cross section of the relevant part of such a multilayered printed circuit board. In this example, a dummy device is used as the semiconductor device accommodated in the recess.

Example 4

A multilayered printed circuit board is produced as in Example 1 except that the following substrate is used as the substrate for accommodating a semiconductor device. The substrate is formed by laminating a first insulating resin in which a metal layer having dimensions corresponding to the dimensions of the semiconductor device is provided on one surface thereof and a second insulating resin substrate in which an opening is provided in an area corresponding to the metal layer in advance to form a recess in which one end of the opening is closed and the metal layer is exposed on the recess.

In the multilayered printed circuit boards according to the above examples, satisfactory adhesiveness, electrical connectivity, connection reliability, and heat-cycle resistance were ensured.

In the case where a taper angle was provided on the side faces of the recess, even when the accommodated semiconductor device was subjected to a thermal stress, an external stress, or the like in the lateral direction, the stress could be relieved. Consequently, the heat-cycle resistance could be ensured. In addition, the phenomenon in which the adhesive used for fixing the semiconductor device was diffused along the side faces of the recess did not occur, and therefore, the adhesiveness of the semiconductor device to the bottom of the recess could be ensured. In particular, it is believed that when the taper angle is in the range of at least 60 degrees and less than 90 degrees, the adhesiveness is more reliably ensured.

Figure 8:
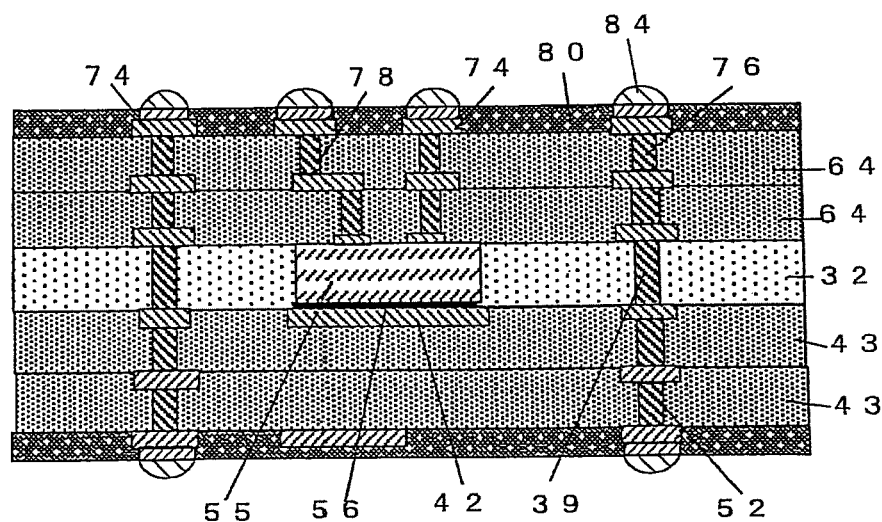
FIG. 8 is a schematic cross-sectional view showing a modification of Example 1 of the present invention.

In the embodiments of the present invention, a plurality of other resin insulating layers and conductor circuits may be formed on the resin insulating layer accommodating a semiconductor device. (For example, as shown in FIG. 8, additional two resin insulating layers may be formed on the resin insulating layer including a semiconductor device.) In such a structure, via holes that electrically connect the semiconductor device to each conductor circuit can be formed.

Figure 9:
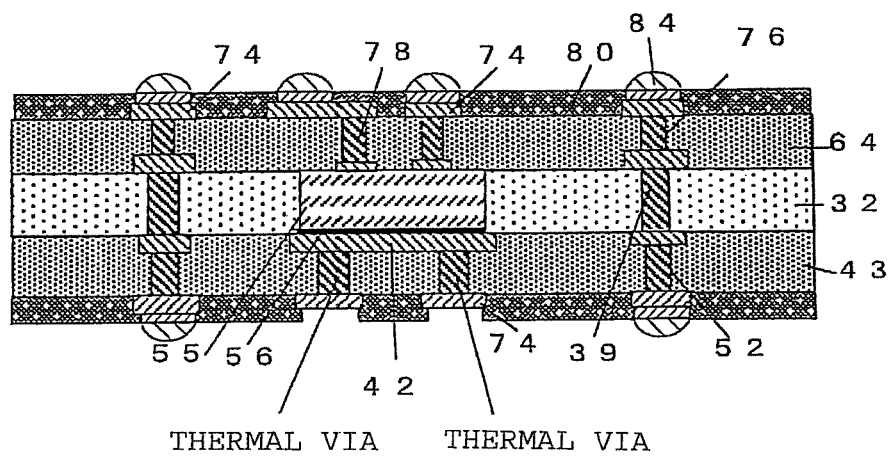
FIG. 9 is a schematic cross-sectional view showing another modification of Example 1 of the present invention.

In the embodiments of the present invention, as shown in FIG. 9, via holes connecting to the metal layer may be formed in a resin insulating layer, and heat generated from the semiconductor device may be dissipated to the outside of the substrate through these via holes. In this structure, the via holes function as thermal vias.

INDUSTRIAL APPLICABILITY

As described above, the multilayered printed circuit board according to the present invention provides a multilayered printed circuit board or a substrate for mounting a semiconductor device in which a recess for accommodating a semiconductor device is provided on a substrate and electrical connectivity and connection reliability are ensured.

What is claimed is:

1. A multilayered printed circuit board comprising:
   a semiconductor device;
   a first resin insulating layer accommodating the semiconductor device, the first resin insulating layer having a first surface and a second surface on an opposite side of the first surface;
   a second resin insulating layer provided on the first surface of the first resin insulating layer;
   a first conductor circuit provided on the second resin insulating layer;
   a second conductor circuit formed on the second surface of the first resin insulating layer and positioned outside the first resin insulating layer; a plurality of via holes electrically connecting the semiconductor device to the first conductor circuit;
   a third resin insulating layer formed on the second surface of the first resin insulating layer; and
   a plurality of thermal via formed in the third resin insulating layer,
   wherein the first resin insulating layer has a recess extending from the first surface to the second surface through the first resin insulating layer, the semiconductor device is accommodated in the recess in the first resin insulating layer, the first resin insulating layer has a metal layer provided on the second surface of the first resin insulating layer and positioned outside the first resin insulating layer such that a portion of the metal layer supports the semiconductor device in the recess, wall surfaces of the recess and side faces of the semiconductor device form a space which is filled with a resin from the second resin insulating layer, and the third resin insulating layer is formed on the metal layer such that the plurality of thermal via is connected to the metal layer.

2. The multilayered printed circuit board according to claim 1, wherein the second resin insulating layer includes a fiber substrate.

3. The multilayered printed circuit board according to claim 1, wherein the second conductor circuit on the first resin insulating layer is electrically connected to the first conductor circuit provided on the second resin insulating layer through via holes.

4. The multilayered printed circuit board according to claim 1, wherein the second conductor circuit on the first resin insulating layer is electrically connected to the first conductor circuit provided on the second resin insulating layer through via holes filled with a metal.

5. The multilayered printed circuit board according to claim 1, wherein the first resin insulating layer has a thickness which is larger than a thickness of the second resin insulating layer.

6. The multilayered printed circuit board according to claim 1, wherein the first conductor circuit on the second resin insulating layer is extended over an area that exceeds a boundary between the semiconductor device and the first resin insulating layer.

7. The multilayered printed circuit board according to claim 1, wherein the metal layer has an area which is larger than an area of the recess on the second surface of the first resin insulating layer.

8. The multilayered printed circuit board according to claim 7, wherein the metal layer is substantially planar.

9. The multilayered printed circuit board according to claim 7, wherein the metal layer is formed of a rolled copper foil.

10. The multilayered printed circuit board according to claim 7, wherein the metal layer is exposed by laser processing.

11. The multilayered printed circuit board according to claim 7, wherein the metal layer has an exposed portion which has a thickness smaller than a thickness of a non-exposed portion of the metal layer.

12. The multilayered printed circuit board according to claim 7, wherein the metal layer has an exposed portion which has a shiny surface.

13. The multilayered printed circuit board according to claim 7, wherein the metal layer has a non-exposed portion which has a matte surface.

14. The multilayered printed circuit board according to claim 7, wherein the semiconductor device is bonded on the metal layer, with an adhesive layer therebetween.

15. The multilayered printed circuit board according to claim 14, wherein the adhesive layer is in contact with a bottom face of the semiconductor device and a bottom periphery of side faces of the semiconductor device.

16. The multilayered printed circuit board according to claim 7, wherein the metal layer is laminated on the second surface of the first resin insulating layer in advance.

17. The multilayered printed circuit board according to claim 1, wherein the wall surfaces of the recess form a tapered shape diverging from the second surface toward the first surface.

18. The multilayered printed circuit board according to claim 17, wherein the tapered shape has an angle in a range of at least 60 degrees and less than 90 degrees.

19. The multilayered printed circuit board according to claim 1, wherein the via holes have openings which are filled with a conductive substance.

20. The multilayered printed circuit board according to claim 1, further comprising:
- a third conductor circuit formed on the third resin insulating layer;
- a plurality of via holes formed in the third resin insulating layer and connecting the third conductor circuit with the metal layer and the second conductor circuit; and
- a solder resist layer formed on the third resin insulating layer and having an opening through which at least a portion of the third conductor circuit connected to the metal layer is exposed.

\* \* \* \* \*